United States Patent
Kim et al.

(10) Patent No.: US 12,495,679 B2
(45) Date of Patent: Dec. 9, 2025

(54) DISPLAY APPARATUS

(71) Applicant: Samsung Display Co., Ltd., Yongin-si (KR)

(72) Inventors: Kwangmin Kim, Yongin-si (KR); Yangwan Kim, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 526 days.

(21) Appl. No.: 17/984,489

(22) Filed: Nov. 10, 2022

(65) Prior Publication Data
US 2023/0209899 A1    Jun. 29, 2023

(30) Foreign Application Priority Data
Dec. 27, 2021  (KR) .................. 10-2021-0188860

(51) Int. Cl.
| | | |
|---|---|---|
| *H01L 27/32* | (2006.01) | |
| *H10D 86/40* | (2025.01) | |
| *H10D 86/60* | (2025.01) | |
| *H10K 59/121* | (2023.01) | |
| *H10K 59/122* | (2023.01) | |
| *H10K 59/131* | (2023.01) | |

(52) U.S. Cl.
CPC ....... *H10K 59/1213* (2023.02); *H10D 86/441* (2025.01); *H10D 86/60* (2025.01); *H10K 59/1216* (2023.02); *H10K 59/122* (2023.02); *H10K 59/1315* (2023.02)

(58) Field of Classification Search
None
See application file for complete search history.

(56) References Cited

U.S. PATENT DOCUMENTS

| | | |
|---|---|---|
| 8,120,246 B2 | 2/2012 | Shibasaki et al. |
| 8,536,580 B2 | 9/2013 | Kang |
| 8,952,609 B2 | 2/2015 | Osako et al. |
| 9,412,801 B2 | 8/2016 | Choi |
| 9,412,802 B2 | 8/2016 | Hyun et al. |
| 10,756,292 B2 | 8/2020 | Tang et al. |
| 10,886,326 B2 | 1/2021 | Bang et al. |
| 2013/0069853 A1* | 3/2013 | Choi ............ H10K 59/124 345/80 |

(Continued)

FOREIGN PATENT DOCUMENTS

| | | |
|---|---|---|
| CN | 107785381 | 3/2018 |
| JP | 5690280 | 3/2015 |

(Continued)

*Primary Examiner* — William C Trapanese
(74) *Attorney, Agent, or Firm* — HARNESS, DICKEY & PIERCE, P.L.C.

(57) ABSTRACT

A display apparatus including a display area, a peripheral area outside the display area, a middle area between the display area and the peripheral area, an organic insulating layer disposed in the display area, the middle area, and the peripheral area, a pixel electrode disposed on the organic insulating layer and in the display area, a conductive layer disposed on the organic insulating layer, in the peripheral area, and including openings, and conductive patterns disposed on the organic insulating layer, disposed in the middle area, and are spaced apart from one another. The pixel electrode, the conductive layer, and the conductive patterns may include a same material.

20 Claims, 13 Drawing Sheets

(56) References Cited

U.S. PATENT DOCUMENTS

2021/0066618 A1    3/2021  Kang et al.

FOREIGN PATENT DOCUMENTS

| KR | 10-1161443       | 7/2012 |
| KR | 10-2013-0005877 A | 1/2013 |
| KR | 10-2013-0031101 A | 3/2013 |
| KR | 10-2015-0039490   | 4/2015 |
| KR | 10-2020-0008837   | 1/2020 |
| KR | 10-2020-0057142 A | 5/2020 |
| KR | 10-2349278       | 1/2022 |

* cited by examiner

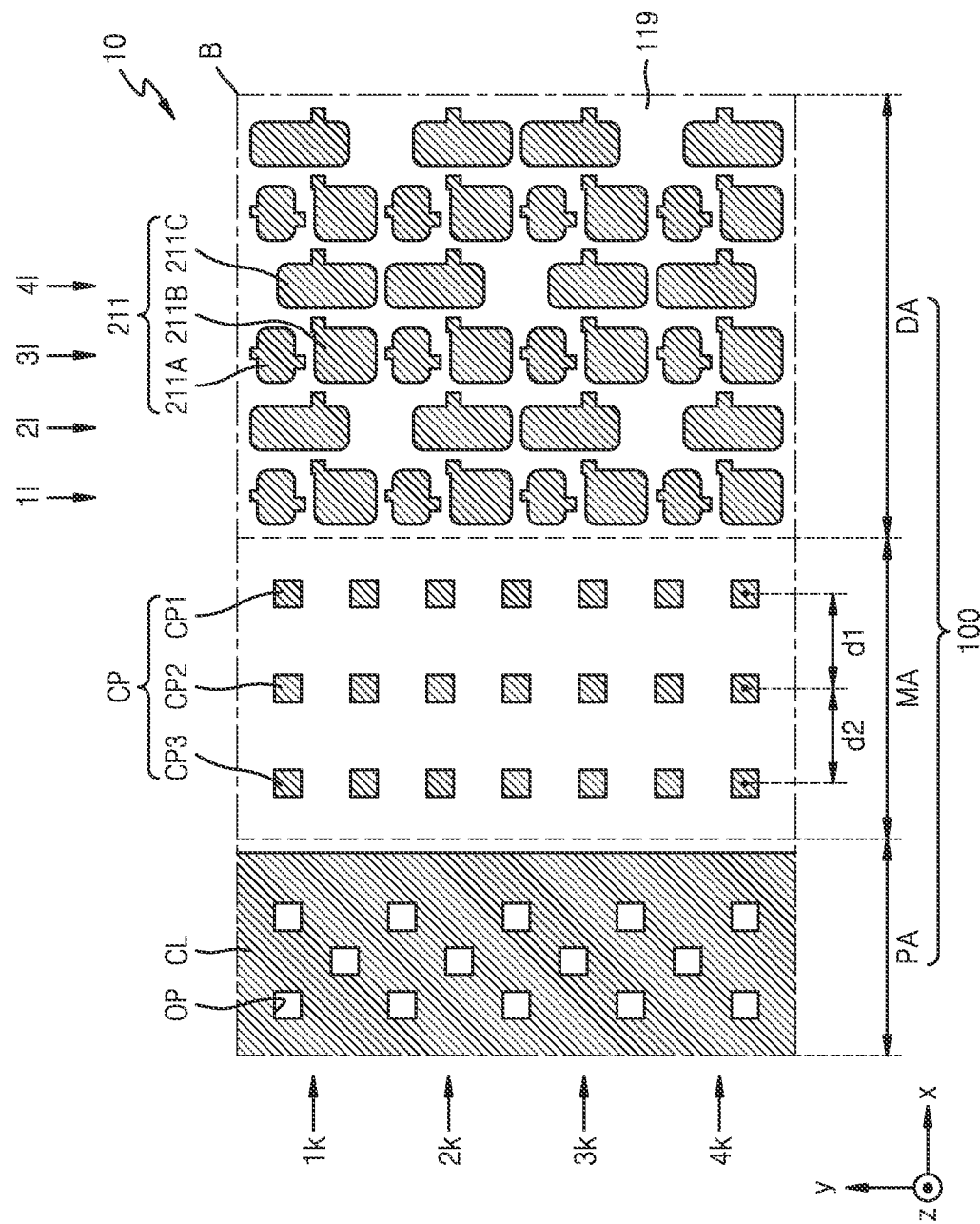

DISPLAY APPARATUS

CROSS-REFERENCE TO RELATED APPLICATION(S)

This application claims priority to and benefits of Korean Patent Application No. 10-2021-0188860 under 35 U.S.C. § 119, filed on Dec. 27, 2021 in the Korean Intellectual Property Office (KIPO), the entire contents of which are incorporated herein by reference.

BACKGROUND

1. Technical Field

One or more embodiments relate to a display apparatus.

2. Description of the Related Art

With the developments in the information society, demand for display apparatuses for displaying images has increased in various forms. Display apparatuses may be used as displays of small products, such as mobile phones, products, such as tablet personal computers (PCs) or laptop computers, and large products, such as televisions.

Such display apparatuses may include an organic insulating layer and a pixel electrode disposed on the organic insulating layer and overlapping a display area that displays an image.

SUMMARY

A display apparatus may include a conductive layer disposed on an organic insulating layer, overlapping a peripheral area arranged outside a display area, and including openings. The organic insulating layer may be exposed in a middle area between the peripheral area and the display area in order to achieve outgassing. The middle area may be visually recognized due to a difference between the reflectivity of the middle area and the reflectivity of the peripheral area and the display area.

One or more embodiments include a display apparatus in which an organic insulating layer may be exposed in a middle area in order to achieve outgassing and a reflectivity difference may be reduced.

Additional aspects will be set forth in portion in the description which follows and, in part, will be apparent from the description, or may be learned by practice of the embodiments of the disclosure.

According to one or more embodiments, a display apparatus may include a display area, a peripheral area outside the display area, a middle area between the display area and the peripheral area, an organic insulating layer disposed in the display area, the middle area, and the peripheral area, a pixel electrode disposed on the organic insulating layer and in the display area, a conductive layer disposed on the organic insulating layer, disposed in the peripheral area, and including openings, and conductive patterns disposed on the organic insulating layer, disposed in the middle area, and spaced apart from one another. The pixel electrode, the conductive layer, and the conductive patterns may include a same material.

The display apparatus may further include a pixel circuit between a substrate and the organic insulating layer, disposed in the display area, and including at least one first transistor and at least one first storage capacitor, and a driving circuit between the substrate and the organic insulating layer, disposed in the peripheral area, and including at least one second transistor and at least one second storage capacitor. The pixel circuit may be electrically connected to the pixel electrode through a contact hole included in the organic insulating layer.

No transistors and no storage capacitors may be disposed in the middle area.

The display apparatus may further include a pixel defining layer disposed on the pixel electrode and the conductive patterns and including a pixel electrode opening overlapping the pixel electrode in a plan view, and the pixel defining layer may extend in the middle area.

The display apparatus may further include patterns disposed on the conductive layer and overlapping the openings in a plan view, wherein the patterns and the pixel defining layer may include a same material.

The display apparatus may further include an emission layer disposed on the pixel electrode opening, and a functional layer including at least one of a first functional layer between the pixel electrode and the emission layer and a second functional layer disposed on the emission layer. The functional layer may extend from the pixel electrode opening to the middle area.

The functional layer may extend from the middle area to the peripheral area.

The display apparatus may further include an opposite electrode between the emission layer and the functional layer, and the opposite electrode may extend from the display area to the peripheral area and directly contact the conductive layer.

The display apparatus may further include a wire between the substrate and the organic insulating layer and in the middle area.

The conductive patterns may include a first conductive pattern, a second conductive pattern, and a third conductive pattern disposed side by side in a direction from the display area to the peripheral area, and a first distance between the first conductive pattern and the second conductive pattern may be equal to a second distance between the second conductive pattern and the third conductive pattern.

The conductive patterns may include a first conductive pattern, a second conductive pattern, and a third conductive pattern disposed side by side in a direction from the display area to the peripheral area, and the first distance between the first conductive pattern and the second conductive pattern may be greater than the second distance between the second conductive pattern and the third conductive pattern.

The conductive patterns may include a first conductive pattern and a second conductive pattern disposed side by side in a direction from the display area to the peripheral area, and a planar area of the first conductive pattern may be less than a planar area of the second conductive pattern.

A planar area of the pixel electrode may be substantially equal to a planar area of one of the conductive patterns.

The pixel electrode may include a first pixel electrode, a second pixel electrode, and a third pixel electrode having different planar shapes. The conductive patterns may include a first conductive pattern, a second conductive pattern, and a third conductive pattern. A planar shape of the first conductive pattern may be substantially equal to a planar shape of the first pixel electrode. A planar shape of the second conductive pattern may be substantially equal to a planar shape of the second pixel electrode. A planar shape of the third conductive pattern may be substantially equal to a planar shape of the third pixel electrode.

The display apparatus may further include a first emission layer overlapping the first pixel electrode in a plan view and emitting red light, a second emission layer overlapping the second pixel electrode in a plan view and emitting green light, and a third emission layer overlapping the third pixel electrode in a plan view and emitting blue light.

According to one or more embodiments, a display apparatus may include a display area, a peripheral area outside the display area, a middle area between the display area and the peripheral area, an organic insulating layer disposed in the display area, the middle area, and the peripheral area, a pixel electrode disposed on the organic insulating layer and in the display area, and a conductive layer disposed on the organic insulating layer and includes openings disposed in the peripheral area and middle openings disposed in the middle area. The pixel electrode and the conductive layer may include a same material, the middle openings may include a first middle opening and a second middle opening disposed in the middle area and disposed side by side in a direction from the display area to the peripheral area, and a planar area of the first middle opening may be greater than a planar area of the second middle opening.

The display apparatus may further include a pixel circuit between a substrate and the organic insulating layer, disposed in the display area, and including at least one first transistor and at least one first storage capacitor, and a driving circuit between the substrate and the organic insulating layer, disposed in the peripheral area, and including at least one second transistor and at least one second storage capacitor. The pixel circuit may be electrically connected to the pixel electrode through a contact hole included in the organic insulating layer.

No transistors and no storage capacitors may be disposed in the middle area.

The display apparatus may further include a pixel defining layer disposed on the pixel electrode and the conductive layer and including a pixel electrode opening overlapping the pixel electrode in a plan view, and patterns disposed on the conductive layer and overlapping the openings in a plan view. The pixel defining layer may extend in the middle area, and the patterns and the pixel defining layer may include a same material.

The display apparatus may further include an emission layer disposed on the pixel electrode opening, a functional layer including at least one of a first functional layer between the pixel electrode and the emission layer and a second functional layer disposed on the emission layer, and an opposite electrode between the emission layer and the functional layer. The opposite electrode may extend from the display area to the peripheral area and directly contact the conductive layer in the peripheral area.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 5A and 5B are schematic plan views of a magnified portion B of the display panel of FIG. 4, according to an embodiment;

DETAILED DESCRIPTION OF THE EMBODIMENTS

Figure 1:
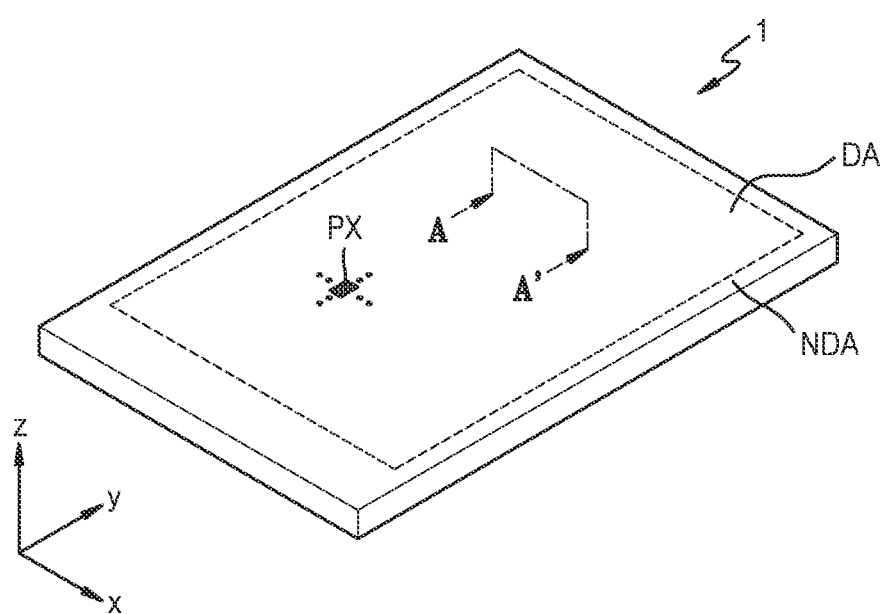
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b, and c" indicates only a, only b, only c, both a and b, both a and c, both b and c, all of a, b, and c, or variations thereof.

It will be understood that although the terms "first," "second," etc. may be used herein to describe various components, these components should not be limited by these terms. These terms are only used to distinguish one component from another.

As used herein, the singular forms "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. For example, since sizes and thicknesses of components in the drawings may be arbitrarily illustrated for convenience of explanation, embodiments of the disclosure are not limited thereto.

When a certain embodiment may be implemented differently, a specific process order may be performed differently from the described order. For example, two consecutively described processes may be performed substantially at the same time or performed in an order opposite to the described order.

It will be understood that the terms "connected to" or "coupled to" may include a physical or electrical connection or coupling. It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 1 according to an embodiment.

Referring to FIG. 1, the display apparatus 1 may display an image. The display apparatus 1 may include a display area DA and a non-display area NDA. Pixels PX may be arranged in the display area DA. The non-display area NDA may surround at least a portion of the display area DA. According to an embodiment, the non-display area NDA may surround the entirety of the display area DA. No pixels PX may be arranged in the non-display area NDA.

FIG. 1 illustrates the display apparatus 1 in which the display area DA may be rectangular. However, according to another embodiment, the display area DA may have the shape of a circle, an oval, or a polygon such as a triangle or a pentagon. FIG. 1 illustrates a case where the display apparatus 1 may be a flat display apparatus, but the display apparatus 1 may be implemented in various other shapes such as a flexible display apparatus, a foldable display apparatus, and a rollable display apparatus.

Multiple pixels PX may be included. The pixels PX may be arranged on the display area DA. The pixels PX may emit light, and the display apparatus 1 may display an image through the display area DA. According to an embodiment, a pixel PX may emit red light, green light, or blue light. According to another embodiment, a pixel PX may emit red light, green light, blue light, or white light.

Each pixel PX may include a display element. According to an embodiment, the display element may be an organic light-emitting diode including an organic emission layer. In other embodiments, the display element may be a light-emitting diode (LED) including an inorganic emission layer. The size of the LED may be microscale or nanoscale. For example, the LED may be a micro-LED. As another example, the LED may be a nanorod LED. The nanorod LED may include gallium nitride (GaN). According to an embodiment, a color converting layer may be arranged on the nanorod LED. The color converting layer may include quantum dots. In other embodiments, the display element may be a quantum dot light-emitting diode including a quantum dot emission layer. A case where the display element may be an organic light-emitting diode will now be focused on and described in detail.

Figure 2:
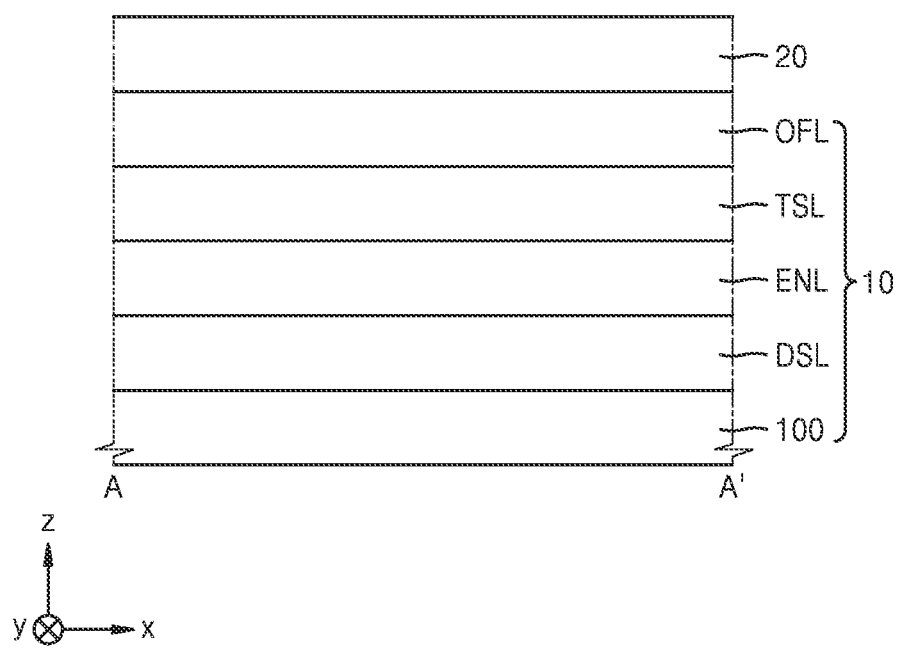
FIG. 2 is a schematic cross-sectional view of the display apparatus of FIG. 1 taken along line A-A'.

FIG. 2 is a schematic cross-sectional view of the display apparatus 1 of FIG. 1 taken along line A-A'.

Referring to FIG. 2, the display apparatus 1 may include a display panel 10 and a cover window 20. The display panel 10 may display an image. The display panel 10 may include a substrate 100, a display layer DSL, an encapsulation layer ENL, a touch sensor layer TSL, and an optical functional layer OFL.

The substrate 100 may include glass, or may include polymer resin such as polyethersulfone, polyacrylate, polyetherimide, polyethylene naphthalate, polyethylene terephthalate, polyphenylene sulfide, polyimide, polycarbonate, cellulose triacetate, cellulose acetate propionate, or a combination thereof. According to an embodiment, the substrate 100 may have a multi-layered structure including a base layer including the aforementioned polymer resin and a barrier layer (not shown). The substrate 100 including polymer resin may be flexible, rollable, and/or bendable.

The display layer DSL may be disposed on the substrate 100. The display layer DSL may include pixel circuits and display elements. The pixel circuits may be connected to the display elements, respectively. Each pixel circuit may include at least one transistor and at least one storage capacitor. The display layer DSL may include an insulating layer interposed between each pixel circuit and each display element.

The encapsulation layer ENL may be disposed on the display layer DSL. The encapsulation layer ENL may be disposed on the display elements and may cover the display elements. According to an embodiment, the encapsulation layer ENL may include at least one inorganic encapsulation layer and at least one organic encapsulation layer. The at least one inorganic encapsulation layer may include one or more inorganic materials from among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). The zinc oxide ($ZnO_x$) may be a zinc oxide (ZnO) and/or a zinc peroxide ($ZnO_2$). The at least one organic encapsulation layer may include a polymer-based material. Examples of the polymer-based material may include an acrylic resin, an epoxy-based resin, polyimide, and/or polyethylene. According to an embodiment, the at least one organic encapsulation layer may include acrylate. According to another embodiment, the encapsulation layer ENL may include an encapsulation substrate. The encapsulation substrate may encapsulate display elements together with an encapsulation member disposed in a non-display area.

The touch sensor layer TSL may be disposed on the encapsulation layer ENL. The touch sensor layer TSL may sense coordinate information according to an external input, for example, a touch event. The touch sensor layer TSL may include a sensor electrode and touch wires connected to the sensor electrode. The touch sensor layer TSL may sense an external input according to a self capacitance method or a mutual capacitance method.

The touch sensor layer TSL may be formed on the encapsulation layer ENL. In other embodiments, the touch sensor layer TSL may be separately provided on a touch substrate and coupled to an upper surface of the encapsulation layer ENL via an adhesive layer, such as an optically clear adhesive (OCA). According to an embodiment, the touch sensor layer TSL may be provided directly on the encapsulation layer ENL. No adhesive layers may be between the touch sensor layer TSL and the encapsulation layer ENL.

The optical functional layer OFL may be disposed on the touch sensor layer TSL. The optical functional layer OFL may reduce reflectivity of light (e.g., external light) that may be incident from an external source toward the display apparatus 1. The optical functional layer OFL may increase the color purity of light emitted by the display apparatus 1. According to an embodiment, the optical functional layer OFL may include a phase retarder and a polarizer. The phase retarder may be of a film type or liquid coating type, and may include a λ/2 phase retarder and/or a λ/4 phase retarder. The polarizer may also be of a film type or liquid coating type. The film type polarizer may include a stretchable synthetic resin film, and the liquid coating type polarizer may include liquid crystals arranged in a certain arrangement. The phase retarder and the polarizer may further include protective films, respectively.

According to another embodiment, the optical functional layer OFL may include a black matrix and color filters. The color filters may be arranged by taking into account the colors of light beams respectively emitted by the pixels of the display apparatus 1. Each of the color filters may include a pigment or dye of a red, green, or blue color. In other embodiments, each of the color filters may further include quantum dots in addition to the above-described pigment or dye. In other embodiments, some of the color filters may not include the above-described pigment or dye, and may include scattered particles such as a titanium oxide.

According to another embodiment, the optical functional layer OFL may include a destructive interference structure. The destructive interference structure may include a first reflective layer and a second reflective layer disposed on different layers. First reflected light and second reflected light respectively reflected by the first reflective layer and the second reflective layer may destructively interfere with each other, and thus the reflectance of external light may be reduced.

The cover window 20 may be disposed on the display panel 10. The cover window 20 may protect the display panel 10. The cover window 20 may include at least one of glass, sapphire, and plastic. For example, the cover window 20 may be ultra-thin glass or colorless polyimide.

Figure 3:
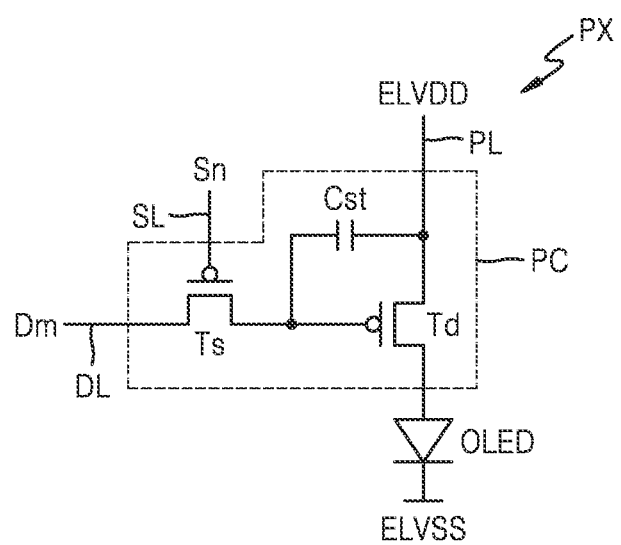
FIG. 3 is a schematic equivalent circuit diagram of a pixel of a display panel according to an embodiment.

FIG. 3 is a schematic equivalent circuit diagram of a pixel PX of a display panel according to an embodiment.

Referring to FIG. 3, the pixel PX may include a pixel circuit PC, and an organic light-emitting diode OLED as a display element electrically connected to the pixel circuit PC. According to an embodiment, the pixel circuit PC may include a driving transistor Td, a switching transistor Ts, and a storage capacitor Cst.

The switching transistor Ts may be connected to a scan line SL and a data line DL, and may transmit, to the driving transistor Td, a data signal Dm received via the data line DL according to a scan signal Sn received via the scan line SL.

The storage capacitor Cst may be connected to the switching transistor Ts and a driving voltage line PL, and may store a voltage corresponding to a difference between a voltage received from the switching transistor Ts and a first power supply voltage ELVDD supplied to the driving voltage line PL.

The driving transistor Td may be connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness according to the driving current. An opposite electrode (for example, a cathode) of the organic light-emitting diode OLED may receive a second power supply voltage ELVSS.

In FIG. 3, the pixel circuit PC includes two transistors and one storage capacitor. However, according to another embodiment, the pixel circuit PC may include three or more transistors.

Figure 4:
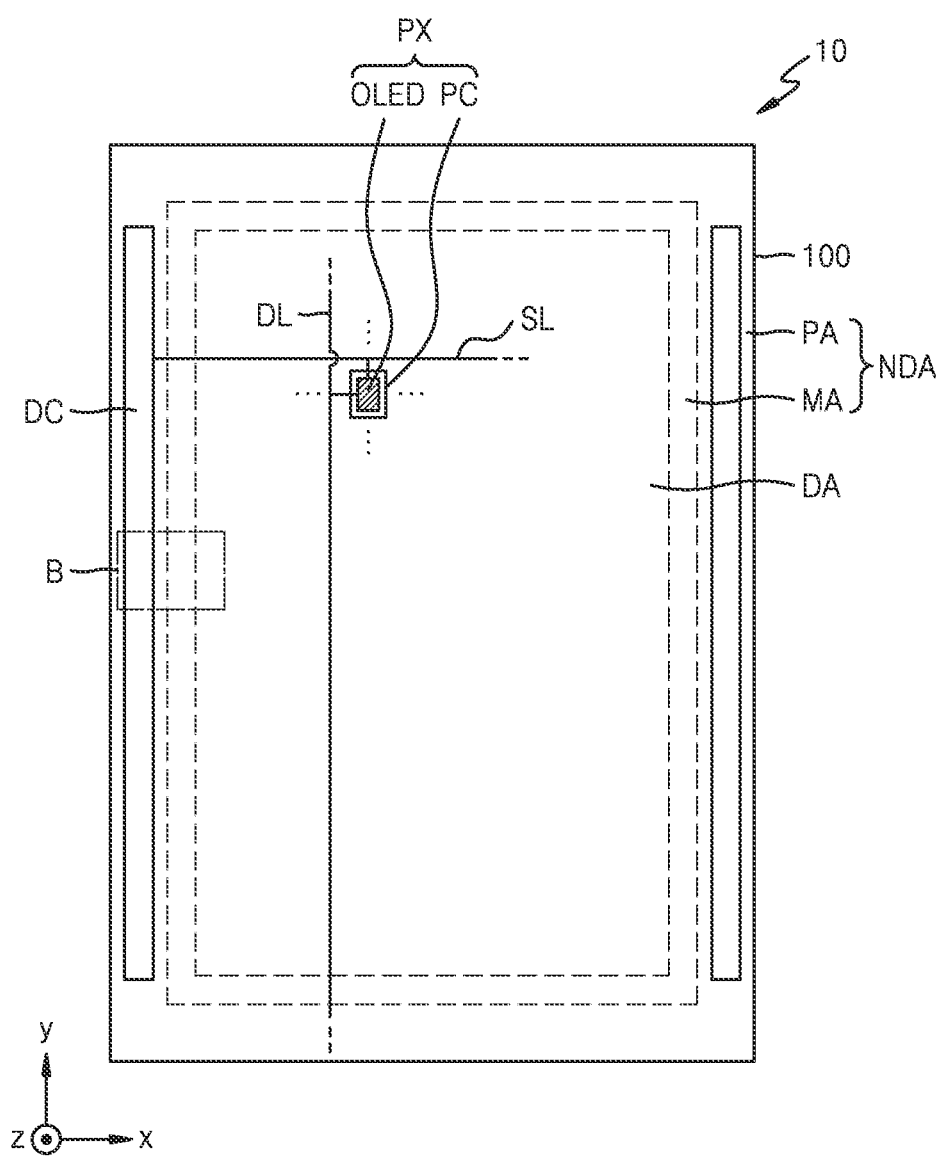
FIG. 4 is a schematic plan view of a display panel according to an embodiment.

FIG. 4 is a schematic plan view of the display panel 10 according to an embodiment.

Referring to FIG. 4, the display panel 10 may include the substrate 100, the pixels PX, the scan lines SL, the data lines DL, and a driving circuit DC. The display panel 10 may include the display area DA and the non-display area NDA. According to an embodiment, the display area DA and the non-display area NDA may be defined on the substrate 100. In other words, the substrate 100 may include the display area DA and the non-display area NDA. The pixels PX may be arranged in the display area DA.

The non-display area NDA may include a peripheral area PA and a middle area MA. The peripheral area PA may be arranged outside the display area DA. The peripheral area PA may surround at least a portion of the display area DA. According to an embodiment, the peripheral area PA may surround the entirety of the display area DA. The driving circuit DC may be arranged in the peripheral area PA.

The middle area MA may be between the display area DA and the peripheral area PA. The middle area MA may surround at least a portion of the display area DA. According to an embodiment, the middle area MA may surround the entirety of the display area DA. No driving circuits DC may be arranged in the middle area MA. Wires extending from the driving circuit DC may be arranged in the middle area MA. For example, the scan lines SL may be arranged in the middle area MA. As another example, the data lines DL may be arranged in the middle area MA.

The pixels PX may be arranged in the display area DA. According to an embodiment, each pixel PX may include a pixel circuit PC, and an organic light-emitting diode OLED. According to an embodiment, the pixel circuit PC may include at least one first transistor and at least one first storage capacitor. The pixel circuit PC may be electrically connected to a scan line SL transmitting a scan signal and a data line DL transmitting a data signal. The organic light-emitting diode OLED may be connected to the pixel circuit PC. Organic light-emitting diodes OLED may be included, and the display panel 10 may display an image by using light beams emitted by the organic light-emitting diodes OLED. The pixel circuit PC may receive the scan signal and the data signal, and the organic light-emitting diode OLED may be controlled by the pixel circuit PC to emit light.

The scan line SL may transmit the scan signal. According to an embodiment, the scan line SL may extend in a first direction (e.g., an x direction or a −x direction). The scan line SL may extend from the peripheral area PA to the middle area MA. The scan line SL may extend from the middle area MA to the display area DA. The scan line SL may be connected to the pixel circuit PC. The scan line SL may receive the scan signal from the driving circuit DC.

The data line DL may transmit the data signal. According to an embodiment, the data line DL may extend in a second direction (e.g., a y direction or a −y direction). According to an embodiment, the data line SL may extend from the peripheral area PA to the middle area MA. The data line DL may extend from the middle area MA to the display area DA. The data line DL may be electrically connected to the pixel circuit PC. According to an embodiment, the data line DL may receive the data signal from a data driving circuit.

The driving circuit DC may be arranged in the peripheral area PA. According to an embodiment, the driving circuit DC may be connected to the scan line SL and may transmit the scan signal to the scan line SL. According to an embodiment, the driving circuit DC may include at least one second transistor and at least one second storage capacitor. The driving circuit DC may not overlap the middle area MA.

Figure 5A:
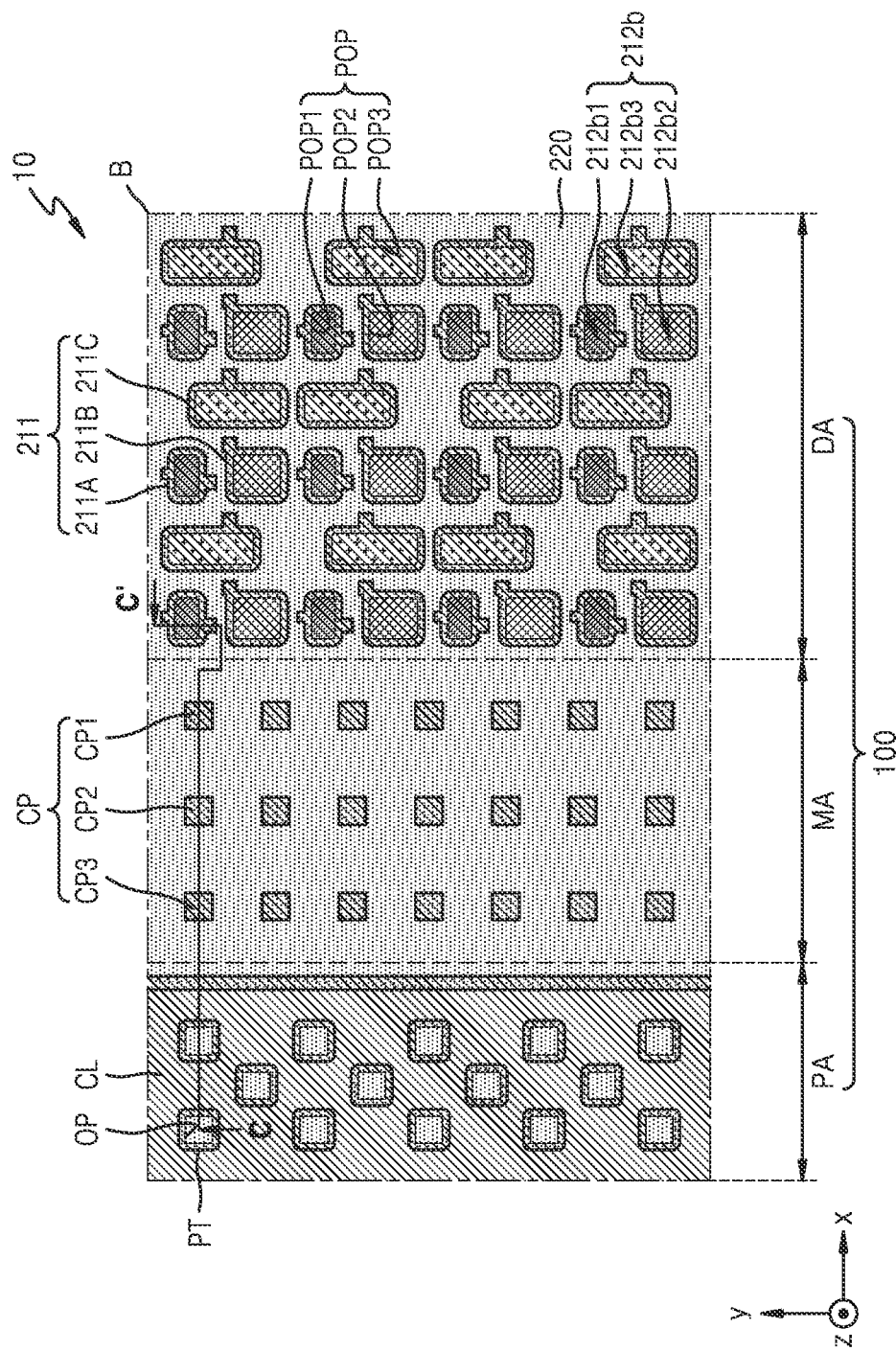

FIGS. 5A and 5B are schematic plan views of a magnified portion B of the display panel 10 of FIG. 4, according to an embodiment. FIG. 5B is a plan view illustrating some of the components illustrated in FIG. 5A.

Referring to FIGS. 5A and 5B, the display panel 10 may include the substrate 100, an organic insulating layer 119, a pixel electrode 211, a conductive layer CL, conductive patterns CP, a pixel defining layer 220, patterns PT, and an emission layer 212b.

The substrate 100 may include the display area DA, the peripheral area PA, and the middle area MA. The peripheral area PA may be arranged outside the display area DA. The middle area MA may be between the display area DA and the peripheral area PA. A pixel circuit may be arranged in the display area DA. According to an embodiment, the pixel circuit may include at least one first transistor and at least one first storage capacitor. A driving circuit may be arranged in the peripheral area PA. According to an embodiment, the driving circuit may include at least one second transistor and at least one second storage capacitor. According to an embodiment, the pixel circuit and the driving circuit may not be arranged in the middle area MA.

The organic insulating layer 119 may be arranged in the display area DA, the middle area, and the peripheral area PA. The organic insulating layer 119 may include an organic material. The organic insulating layer 119 may include an organic insulating material, such as a commercial polymer (such as PMMA or PS), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a blend thereof.

The pixel electrode 211 may be disposed on the organic insulating layer 119. The pixel electrode 211 may overlap the display area DA. The pixel electrode 211 may include conductive oxide such as indium tin oxide (ITO), indium zinc oxide (IZO), zinc oxide (ZnO), indium oxide (In$_2$O$_3$), indium gallium oxide (IGO), and/or aluminum zinc oxide (AZO). According to another embodiment, the pixel electrode 211 may include a reflective layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another embodiment, the pixel electrode 211 may further include a film formed of ITO, IZO, ZnO, and/or In$_2$O$_3$ over/under the reflective layer.

According to an embodiment, the pixel electrode 211 may include a first pixel electrode 211A, a second pixel electrode 211B, and a third pixel electrode 211C. The first pixel electrode 211A, the second pixel electrode 211B, and the third pixel electrode 211C may have different planar shapes. For example, a length of the first pixel electrode 211A in the second direction (for example, the y direction or the −y direction) may be less than that of the second pixel electrode 211B in the second direction (for example, the y direction or the −y direction). A length of the second pixel electrode 211B in the second direction (for example, the y direction or the −y direction) may be less than that of the third pixel electrode 211C in the second direction (for example, the y direction or the −y direction). A length of the first pixel electrode 211A in the first direction (for example, the x direction or the −x direction), a length of the second pixel electrode 211B in the first direction (for example, the x direction or the −x direction), and a length of the third pixel electrode 211C in the first direction (for example, the x direction or the −x direction) may be substantially equal to one another.

The first pixel electrode 211A and the second pixel electrode 211B may be alternately arranged in the second direction (for example, the y direction or the −y direction). For example, the first pixel electrode 211A and the second pixel electrode 211B may be alternately arranged in a first column 11. The third pixel electrode 211C may be arranged adjacent to the first pixel electrode 211A and the second pixel electrode 211B. Multiple third pixel electrodes 211C may be included, and the third pixel electrodes 211C may be arranged apart from each other in the second direction (for example, the y direction or the −y direction). For example, the third pixel electrodes 211C may be alternately arranged in a second column 21 adjacent to the first column 11. First pixel electrodes 211A and second pixel electrodes 211B adjacent to the third pixel electrodes 211C may be alternately arranged in the second direction (for example, the y direction or the −y direction). For example, the first pixel electrodes 211A and the second pixel electrodes 211B may be alternately arranged in a third column 31 adjacent to the second column 21. Thus, a third pixel electrode 211C may be arranged between multiple first pixel electrodes 211A or between multiple second pixel electrodes 211B. The third pixel electrode 211C may be arranged adjacent to the first pixel electrode 211A and the second pixel electrode 211B. Multiple third pixel electrodes 211C may be included, and the third pixel electrodes 211C may be arranged apart from each other in the second direction (for example, the y direction or the −y direction). For example, the third pixel electrodes 211C may be alternately arranged in a fourth column 41 adjacent to the third column 31. This arrangement of the pixel electrodes 211 may be repeated in the first direction (e.g., the x direction or the −x direction) and/or the second direction (e.g., the y direction or the −y direction).

Multiple first pixel electrodes 211A may be spaced apart from one another in the first direction (e.g., the x direction or the −x direction) or the second direction (e.g., the y direction or the −y direction). Multiple second pixel electrodes 211B may be spaced apart from one another in the first direction (e.g., the x direction or the −x direction) or the second direction (e.g., the y direction or the −y direction).

The third pixel electrodes 211C may be arranged at preset intervals in the second direction (for example, the y direction or the −y direction). For example, an interval between a third pixel electrode 211C in the second column 21 and a first row 1k and a third pixel electrode 211C in the second column 21 and a second row 2k adjacent to the first row 1k may be greater than an interval between the third pixel electrode 211C in the second column 21 and the second row 2k and a third pixel electrode 211C in the second column 21 and a third row 3k adjacent to the second row 2k. The interval between the third pixel electrode 211C in the second column 21 and the second row 2k and the third pixel electrode 211C in the second column 21 and the third row 3k may be less than an interval between the third pixel electrode 211C in the second column 21 and the third row 3k and a third pixel electrode 211C in the second column 21 and a fourth row 4k adjacent to the third row 3k. An interval between a third pixel electrode 211C in a fourth column 41 and the first row 1k and a third pixel electrode 211C in the fourth column 41 and the second row 2k may be less than an interval between the third pixel electrode 211C in the fourth column 41 and the second row 2k and a third pixel electrode 211C in the fourth column 41 and the third row 3k. The interval between the third pixel electrode 211C in the fourth column 41 and the second row 2k and the third pixel electrode 211C in the fourth column 41 and the third row 3k may be greater than an interval between the third pixel electrode 211C in the fourth column 41 and the third row 3k and a third pixel electrode 211C in the fourth column 41 and a fourth row 4k. This arrangement of the pixel electrodes 211 may be repeated in the first direction (e.g., the x direction or the −x direction) and/or the second direction (e.g., the y direction or the −y direction).

The conductive layer CL may be disposed on the organic insulating layer 119. The conductive layer CL may overlap the peripheral area PA. The conductive layer CL may include the same material as that of the pixel electrode 211. The conductive layer CL may include conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to another embodiment, the conductive layer CL may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another embodiment, the conductive layer CL may further include a film formed of ITO, IZO, ZnO, and/or $In_2O_3$ over/under the reflection layer. The conductive layer CL may be a layer for reducing static electricity in the peripheral area PA. Accordingly, the conductive layer CL may protect the driving circuit.

The conductive layer CL may include openings OP. The openings OP may be spaced apart from one another in the first direction (e.g., the x direction or the −x direction) or the second direction (e.g., the y direction or the −y direction). Gas emitted from the organic insulating layer 119 may escape through the openings OP.

The conductive patterns CP may be arranged on the organic insulating layer 119. The conductive patterns CP may overlap the middle area MA. The conductive patterns CP may be spaced apart from one another in the first direction (e.g., the x direction or the −x direction) or the second direction (e.g., the y direction or the −y direction). According to an embodiment, the conductive patterns CP may be dummy electrodes. The conductive patterns CP may be in a floating state. In other words, the conductive patterns CP may be electrically insulated from other electrodes or metals.

According to an embodiment, the conductive patterns CP may include first conductive patterns CP1, second conductive patterns CP2, and third conductive patterns CP3 arranged side by side in a direction from the display area DA to the peripheral area PA. According to an embodiment, the first conductive patterns CP1, the second conductive patterns CP2, and the third conductive patterns CP3 may have the same planar shapes. According to an embodiment, a first distance d1 between the first conductive pattern CP1 and the second conductive pattern CP2 may be equal to a second distance d2 between the second conductive pattern CP2 and the third conductive pattern CP3. The first distance d1 may be a distance between a center of the first conductive pattern CP1 and a center of the second conductive pattern CP2. The second distance d2 may be a distance between a center of the second conductive pattern CP2 and a center of the third conductive pattern CP3.

The conductive patterns CP may include the same material as that of the pixel electrode 211. According to an embodiment, the pixel electrode 211, the conductive layer CL, and the conductive patterns CP may include the same material. According to an embodiment, the pixel electrode 211, the conductive layer CL, and the conductive patterns CP may be formed in the same process.

According to an embodiment, the conductive patterns CP may include conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). According to another embodiment, the conductive patterns CP may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another embodiment, the conductive patterns CP may further include a film formed of ITO, IZO, ZnO, and/or $In_2O_3$ over/under the reflection layer.

Because the conductive patterns CP may be spaced apart from one another, a portion of the organic insulating layer 119 arranged in the middle area MA may be at least partially exposed. Thus, gas may be emitted from the organic insulating layer 119 disposed in the middle area MA to between adjacent conductive patterns CP, and degradation of the emission layer 212b arranged in the display area DA may be prevented or reduced. Accordingly, the lifespan of the display panel 10 may be increased. The conductive patterns CP may include the same material as the pixel electrode 211 disposed in the display area DA and the conductive layer CL disposed in the peripheral area PA. In case that the conductive patterns CP are not disposed in the middle area MA in contrast with an embodiment, reflectivity of the display panel 10 in the middle area MA may be different from reflectivity of the display panel 10 in the peripheral area PA and the display area DA. A band shape may be visually recognized on the display panel 10. According to an embodiment, because the conductive patterns CP may be disposed in the middle area MA, a difference between the reflectivity of the display panel 10 in the middle area MA and the reflectivity of the display panel 10 in the peripheral area PA and the display area DA may be reduced. Accordingly, a band shape may not be visually recognized on the display panel 10.

The pixel defining layer 220 may be disposed on the pixel electrode 211 and the conductive patterns CP. The pixel defining layer 220 may include an organic insulating material and/or an inorganic insulating material. According to some embodiments, the pixel defining layer 220 may include a light blocking material.

The pixel defining layer 220 may include a pixel electrode opening POP overlapping the pixel electrode 211. The pixel electrode opening POP may expose a center portion of the pixel electrode 211. The pixel electrode opening POP may define a light-emission area of light emitted by an organic light-emitting diode. According to an embodiment, the pixel electrode opening POP may include a first pixel electrode opening POP1, a second pixel electrode opening POP2, and a third pixel electrode opening POP3. The first pixel electrode opening POP1 may overlap the first pixel electrode 211A. The second pixel electrode opening POP2 may overlap the second pixel electrode 211B. The third pixel electrode opening POP3 may overlap the third pixel electrode 211C.

The pixel defining layer 220 may continuously extend in the middle area MA. According to an embodiment, the pixel defining layer 220 may cover respective edges of the conductive patterns CP. Accordingly, damage to the respective edges of the conductive patterns CP during the manufacture of the display panel 10 may be prevented or reduced. According to an embodiment, the pixel defining layer 220 may extend from the middle area MA to the peripheral area PA, and may cover an edge of the conductive layer CL. Accordingly, the pixel defining layer 220 may prevent or reduce damage to the edge of the conductive layer CL during the manufacture of the display panel 10.

The patterns PT may overlap the peripheral area PA. The patterns PT may include the same material as that of the pixel defining layer 220. According to an embodiment, the pixel defining layer 220 and the patterns PT may be formed in the same process. According to an embodiment, the patterns PT may be spaced apart from one another in the first direction (e.g., the x direction or the −x direction) and/or the second direction (e.g., the y direction or the −y direction).

According to an embodiment, the patterns PT may include an organic insulating material and/or an inorganic insulating material. According to some embodiments, the patterns PT may include a light blocking material. According to an embodiment, the patterns PT may overlap the openings OP, respectively. The patterns PT may cover a first inner edge of the conductive layer CL that covers the openings OP. Accordingly, the patterns PT may prevent or reduce damage to the first inner edge of the conductive layer CL during the manufacture of the display panel 10.

The emission layer 212b may overlap the pixel electrode opening POP. The emission layer 212b may overlap the pixel electrode 211. The emission layer 212b may include a low molecular weight or high molecular weight organic material that emits light of a certain color. According to an embodiment, the emission layer 212b may include a first emission layer 212b1, a second emission layer 212b2, and a third emission layer 212b3. The first emission layer 212b1 may overlap the first pixel electrode 211A and emit red light. The second emission layer 212b2 may overlap the second pixel electrode 211B and emit green light. The third emission layer 212b3 may overlap the third pixel electrode 211C and emit blue light.

Figure 6:
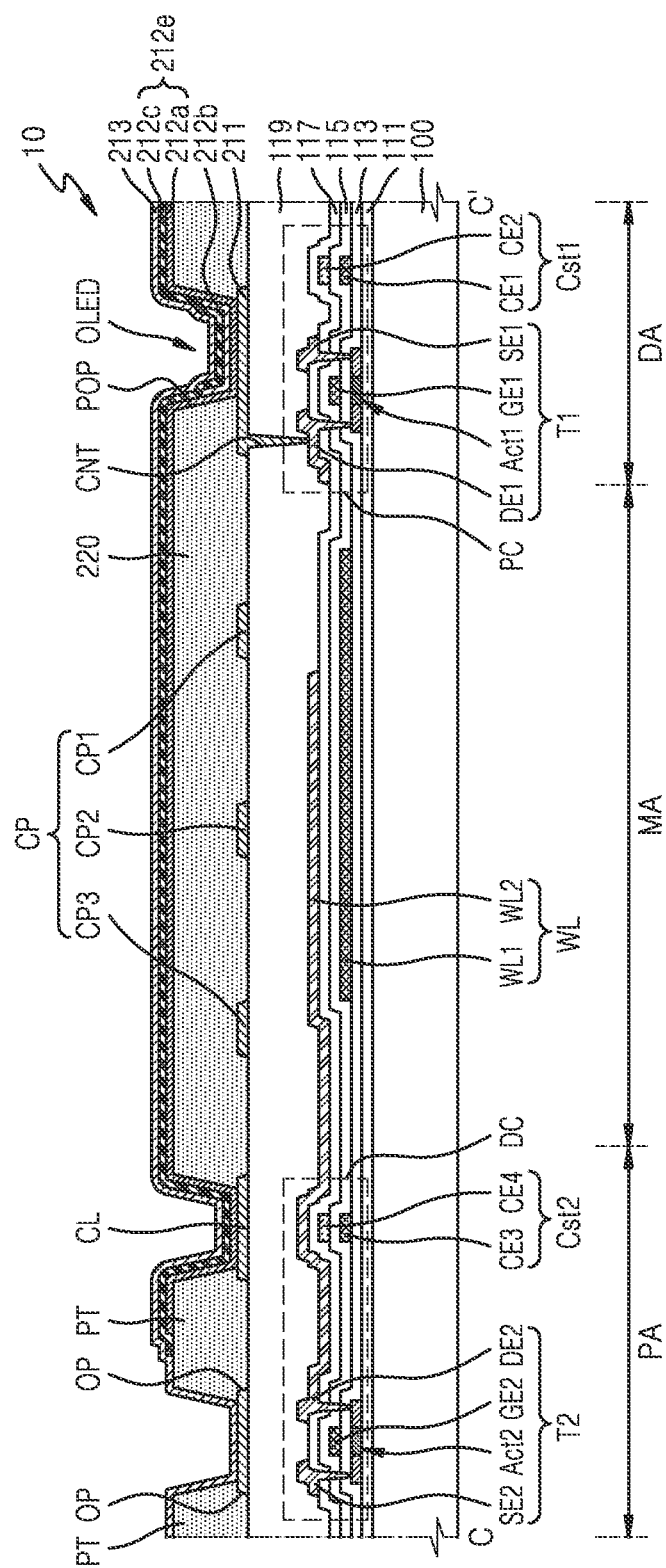
FIG. 6 is a schematic cross-sectional view of the display panel of FIG. 5A taken along line C-C' of FIG. 5.

FIG. 6 is a schematic cross-sectional view of the display panel 10 of FIG. 5A taken along line C-C' of FIG. 5A.

Referring to FIG. 6, the display panel 10 may include the substrate 100 and a display layer. The substrate 100 may include the display area DA, the peripheral area PA, and the middle area MA. The peripheral area PA may be arranged outside the display area DA. The middle area MA may be between the display area DA and the peripheral area PA.

The display layer may be disposed on the substrate 100. The display layer may include a pixel circuit layer and a display element layer. The pixel circuit layer may include a buffer layer 111, a first gate insulating layer 113, a second gate insulating layer 115, an interlayer insulating layer 117, the pixel circuit PC, a wire WL, the driving circuit DC, and the organic insulating layer 119.

The buffer layer 111 may be disposed on the substrate 100. The buffer layer 111 may include an inorganic insulating material, such as silicon nitride ($SiN_x$), silicon oxynitride (SiON), and/or silicon oxide ($SiO_2$), and may have a single-layer or multi-layer structure including the inorganic insulating material.

The pixel circuit PC and the driving circuit DC may be disposed on the buffer layer 111. According to an embodiment, the pixel circuit PC and the driving circuit DC may be between the substrate 100 and the organic insulating layer 119. The pixel circuit PC may overlap the display area DA. The driving circuit DC may overlap the peripheral area PA. The pixel circuit PC and the driving circuit DC may not overlap the middle area MA. According to an embodiment, the pixel circuit PC may include at least one first transistor T1 and at least one first storage capacitor Cst1. According to an embodiment, the at least one first transistor T1 may include a first semiconductor layer Act1, a first gate electrode GE1, a first source electrode SE1, and a first drain electrode DE1. The at least one first storage capacitor Cst1 may include a first electrode CE1 and a second electrode CE2. According to an embodiment, the driving circuit DC may include at least one second transistor T2 and at least one second storage capacitor Cst2. According to an embodiment, the at least one second transistor T2 may include a second semiconductor layer Act2, a second gate electrode GE2, a second source electrode SE2, and a second drain electrode DE2. The at least one second storage capacitor Cst2 may include a third electrode CE3 and a fourth electrode CE4.

The first semiconductor layer Act1 and the second semiconductor layer Act2 may be disposed on the buffer layer 111. At least one of the first semiconductor layer Act1 and the second semiconductor layer Act2 may include polysilicon. In other embodiments, at least one of the first semiconductor layer Act1 and the second semiconductor layer Act2 may include amorphous silicon, may include an oxide semiconductor, or may include an organic semiconductor. According to an embodiment, each of the first semiconductor layer Act1 and the second semiconductor layer Act2 may include a channel region, and a source region and a drain region respectively arranged on both sides of the channel region.

The first gate insulating layer 113 may cover the first semiconductor layer Act1 and the second semiconductor layer Act2. The first gate insulating layer 113 may be arranged in the display area DA, the middle area MA, and the peripheral area PA. The first gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). The zinc oxide ($ZnO_x$) may include a zinc oxide (ZnO) and/or a zinc peroxide ($ZnO_2$).

The first gate electrode GE1 and the second gate electrode GE2 may be disposed on the first insulating layer 113. The first gate electrode GE1 may overlap the channel region of the first semiconductor layer Act1. The second gate electrode GE2 may overlap the channel region of the second semiconductor layer Act2. At least one of the first gate electrode GE1 and the second gate electrode GE2 may include a low-resistance metal material. At least one of the first gate electrode GE1 and the second gate electrode GE2 may include a conductive material including, for example, molybdenum (Mo), aluminum (Al), copper (Cu), and/or titanium (Ti), and may have a multi-layer or single-layer structure including the aforementioned materials.

The first electrode CE1 and the third electrode CE3 may be disposed on the first gate insulating layer 113. At least one of the first electrode CE1 and the and the third electrode CE3 may include a low-resistance metal material. At least one of the first electrode CE1 and the third electrode CE3 may include a conductive material including, for example, molybdenum (Mo), aluminum (Al), copper (Cu), and/or titanium (Ti), and may have a multi-layer or single-layer structure including the aforementioned materials. According to an embodiment, the first gate electrode GE1, the second gate electrode GE2, the first electrode CE1, and the third electrode CE3 may be formed in the same process and may include the same material.

The second gate insulating layer 115 may cover the first gate electrode GE1, the second gate electrode GE2, the first electrode CE1, and the third electrode CE3. The second gate insulating layer 115 may be arranged in the display area DA, the middle area MA, and the peripheral area PA. The second gate insulating layer 115 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The second electrode CE2 and the fourth electrode CE4 may be disposed on the second gate insulating layer 115. The second electrode CE2 may overlap the first electrode CE1 with the second gate insulating layer 115 therebetween, and the first electrode CE1 and the second electrode CE2 may constitute the first storage capacitor Cst1. The fourth electrode CE4 may overlap the third electrode CE3 between the second gate insulating layer 115 therebetween, and the third electrode CE3 and the fourth electrode CE4 may constitute the second storage capacitor Cst2.

In FIG. 6, the first transistor T1 and the first storage capacitor Cst1 may not overlap each other. According to another embodiment, the first transistor T1 and the first storage capacitor Cst1 may overlap each other. The first gate electrode GE1 and the first electrode CE1 may be integrally provided.

At least one of the second and fourth electrodes CE2 and CE4 may include aluminum (AI), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may each be a single layer or multi-layer including the aforementioned materials.

The interlayer insulating layer 117 may cover the second electrode CE2 and the fourth electrode CE4. The interlayer insulating layer 117 may be arranged in the display area DA, the middle area MA, and the peripheral area PA. The interlayer insulating layer 117 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The first source electrode SE1, the first drain electrode DE1, the second source electrode SE2, and the second drain electrode DE2 may be disposed on the interlayer insulating layer 117. The first source electrode SE1 and the first drain electrode DE1 may each be connected to the first semiconductor layer Act1 via respective contact holes of the first insulating layer 113, the second gate insulating layer 115, and the interlayer insulating layer 117. The second source electrode SE2 and the second drain electrode DE2 may each be connected to the second semiconductor layer Act2 via respective contact holes of the first insulating layer 113, the second gate insulating layer 115, and the interlayer insulating layer 117. At least one of the first source electrode SE1, the first drain electrode DE1, the second source electrode SE2, and the second drain electrode DE2 may include a conductive material including Mo, Al, Cu, Ti, or the like, or a combination thereof, and may have a multi-layer or single-layer structure including the aforementioned materials. At least one of the first source electrode SE1, the first drain electrode DE1, the second source electrode SE2, and the second drain electrode DE2 may have a multi-layer structure of Ti/Al/Ti.

The wire WL may be arranged in the middle area MA. According to an embodiment, the wire WL may be between the substrate 100 and the organic insulating layer 119. According to an embodiment, the wire WL may extend from the peripheral area PA to the middle area MA. The wire WL may be a signal line that transmits a signal. For example, the wire WL may be a scan line that transmits a scan signal, or a data line that transmits a data signal. According to another embodiment, the wire WL may be a power wire.

According to an embodiment, the wire WL may include a first wire WL1 and a second wire WL2. The first wire WL1 may be between the first gate insulating layer 113 and the second gate insulating layer 115. The first wire WL1 may include a low resistance metal material. The first wire WL1 may include a conductive material including molybdenum (Mo), aluminum (Al), copper (Cu), and/or titanium (Ti), and may be formed as a multi-layer or single layer including the aforementioned materials. According to an embodiment, the first gate electrode GE1, the second gate electrode GE2, the first electrode CE1, the third electrode CE3, and the first wire WL1 may be formed in the same process and may include the same material.

According to some embodiments, the first wire WL1 may be between the second gate insulating layer 115 and the interlayer insulating layer 117. The first wire WL1 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multi-layer including the aforementioned materials. According to an embodiment, the second electrode CE2, the fourth electrode CE4, and the first wire WL1 may be formed in the same process and may include the same material.

The second wire WL2 may be disposed on the interlayer insulating layer 117. According to some embodiments, the second wire WL2 may extend from the driving circuit DC. The second wire WL2 may include a conductive material including molybdenum (Mo), aluminum (Al), copper (Cu), titanium (Ti), or the like, or a combination thereof, and may be formed as a multi-layer or single layer including the aforementioned materials. The second wire WL2 may have a multi-layer structure of Ti/Al/Ti.

The organic insulating layer 119 may be disposed on the first source electrode SE1, the first drain electrode DE1, the second source electrode SE2, the second drain electrode DE2, the second wire WL2, and the interlayer insulating layer 117. The organic insulating layer 119 may be arranged in the display area DA, the middle area MA, and the peripheral area PA. The organic insulating layer 119 may include an organic material.

The display element layer may be disposed on the pixel circuit layer. The display element layer may include an organic light-emitting diode OLED, the conductive layer CL, the conductive patterns CP, the pixel defining layer 220, and the patterns PT.

The organic light-emitting diode OLED, which may be a display element, may include the pixel electrode 211, the emission layer 212b, and an opposite electrode 213. The pixel electrode 211 may be connected to the pixel circuit PC through a contact hole CNT included in the organic insulating layer 119. Accordingly, the organic light-emitting diode OLED may be controlled by the pixel circuit PC.

The conductive layer CL may be disposed on the organic insulating layer 119. The conductive layer CL may overlap the peripheral area PA. The conductive layer CL may include the same material as that of the pixel electrode 211. According to an embodiment, the conductive layer CL may be a power wire. The conductive layer CL may transmit a second power supply voltage to the opposite electrode 213. The conductive layer CL may be a layer for reducing static electricity in the peripheral area PA. The conductive layer CL may protect the driving circuit DC.

The conductive layer CL may include the openings OP. Accordingly, gas emitted by the organic insulating layer 119 may be discharged through the openings OP, and may prevent or reduce degradation of the emission layer 212b. Accordingly, the lifespan of the display panel 10 may be increased.

The conductive patterns CP may be arranged on the organic insulating layer 119. The conductive patterns CP may overlap the middle area MA. The conductive patterns CP may be entirely surrounded by the organic insulating layer 119 and the pixel defining layer 220. The conductive patterns CP may be in a floating state. According to an embodiment, the conductive patterns CP may include first conductive patterns CP1, second conductive patterns CP2, and third conductive patterns CP3 arranged side by side in a direction from the display area DA to the peripheral area PA. The conductive patterns CP may include the same material as that of the pixel electrode 211. According to an embodiment, the pixel electrode 211, the conductive layer CL, and the conductive patterns CP may include the same material.

Because the conductive patterns CP may be spaced apart from one another, a portion of the organic insulating layer 119 arranged in the middle area MA may be at least partially exposed. Thus, gas may be emitted from the organic insulating layer 119 disposed in the middle area MA, and degradation of the emission layer 212b may be prevented or reduced. Accordingly, the lifespan of the display panel 10 may be increased. The conductive patterns CP may include the same material as the pixel electrode 211 arranged in the display area DA and the conductive layer CL arranged in the peripheral area PA, and, because the conductive patterns CP may be disposed in the middle area MA, a difference between the reflectivity of the display panel 10 in the middle area MA and the reflectivity of the display panel 10 in the peripheral area PA and the display area DA may be reduced. Accordingly, a band shape may not be visually recognized on the display panel 10.

The pixel defining layer 220 may be disposed on the pixel electrode 211 and the conductive patterns CP. The pixel defining layer 220 may include an organic insulating material and/or an inorganic insulating material. According to some embodiments, the pixel defining layer 220 may include a light blocking material.

The pixel defining layer 220 may include a pixel electrode opening POP overlapping the pixel electrode 211. The pixel electrode opening POP may expose a center portion of the pixel electrode 211. The pixel electrode opening POP may define a light-emission area of light emitted by an organic light-emitting diode.

The pixel defining layer 220 may continuously extend in the middle area MA. According to an embodiment, the pixel defining layer 220 may cover respective edges of the conductive patterns CP. Accordingly, damage to the respective edges of the conductive patterns CP during the manufacture of the display panel 10 may be prevented or reduced. According to an embodiment, the pixel defining layer 220 may extend from the middle area MA to the peripheral area PA, and may cover an edge of the conductive layer CL. Accordingly, the pixel defining layer 220 may prevent or reduce damage to the edge of the conductive layer CL during the manufacture of the display panel 10.

The patterns PT may overlap the peripheral area PA. The patterns PT may include the same material as that of the pixel defining layer 220. According to an embodiment, the patterns PT may overlap the openings OP, respectively. The patterns PT may cover a first inner edge of the conductive layer CL that covers the openings OP. Accordingly, the patterns PT may prevent or reduce damage to the first inner edge of the conductive layer CL during the manufacture of the display panel 10.

The emission layer 212b may overlap the pixel electrode opening POP. The emission layer 212b may overlap the pixel electrode 211. The emission layer 212b may include a low molecular weight or high molecular weight organic material that emits light of a certain color.

The organic light-emitting diode OLED may further include a functional layer 212e. The functional layer 212e may include at least one of a first functional layer 212a and a second functional layer 212c. The first functional layer 212a may be between the pixel electrode 211 and the emission layer 212b. The first functional layer 212a may include, for example, a hole transport layer (HTL), or may include an HTL and a hole injection layer (HIL). The second functional layer 212c may be between the emission layer 212b and the opposite electrode 213. The second functional layer 212c may include an electron transport layer (ETL) and/or an electron injection layer (EIL). A case where the functional layer 212e includes the first functional layer 212a and the second functional layer 212c will now be focused on and described in detail.

The functional layer 212e may extend from the pixel electrode opening POP to the middle area MA. The functional layer 212e may extend from the middle area MA to the peripheral area PA. The functional layer 212e may have an edge arranged in the peripheral area PA. According to an embodiment, the functional layer 212e may directly contact a portion of the conductive layer CL, and may not contact another portion of the conductive layer CL.

The opposite electrode 213 may be disposed on the pixel electrode 211, the emission layer 212b, the functional layer 212e, and the pixel defining layer 220. The opposite electrode 213 may include a conductive material having a low work function. For example, the opposite electrode 213 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of these materials. In other embodiments, the opposite electrode 213 may further include a layer, such as ITO, IZO, ZnO, and/or $In_2O_3$, on the (semi)transparent layer including any of the above-described materials.

The opposite electrode 213 may extend from the display area DA to the middle area MA. The opposite electrode 213 may extend from the middle area MA to the peripheral area PA. The opposite electrode 213 may directly contact the conductive layer CL. Thus, the conductive layer CL may supply a second power supply voltage to the opposite electrode 213 while maintaining a low resistance.

Figure 7:
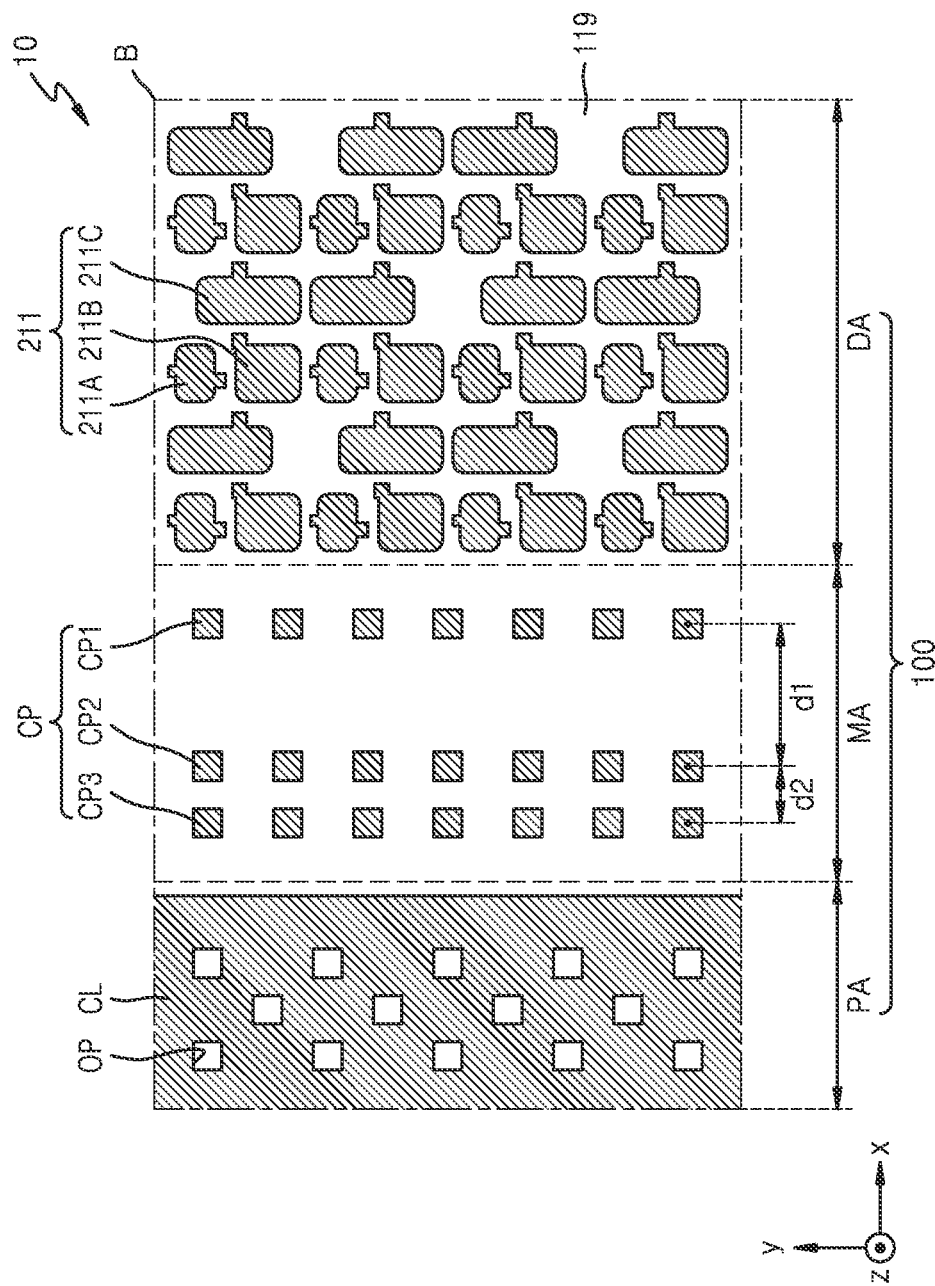
FIG. 7 is a schematic plan view of a magnification of a portion B of the display panel of FIG. 4, according to another embodiment.
Figure 8:
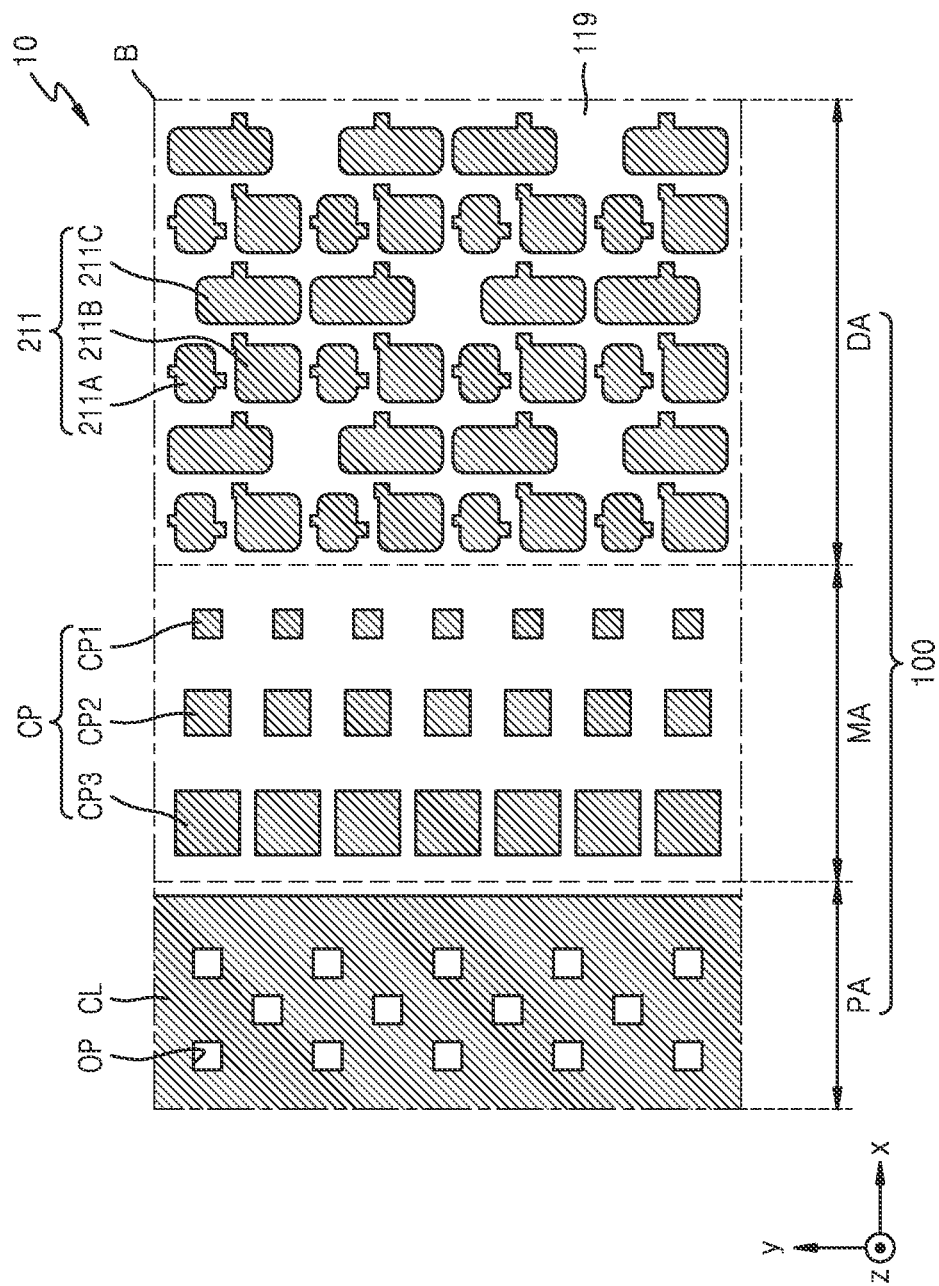
FIG. 8 is a schematic plan view of a magnified portion B of the display panel of FIG. 4, according to another embodiment.

FIG. 7 is a schematic plan view of a magnification of a portion B of the display panel 10 of FIG. 4, according to another embodiment. FIG. 8 is a schematic plan view of a magnification of a portion B of the display panel 10 of FIG. 4, according to another embodiment. Reference numerals in FIGS. 7 and 8 that are the same as the reference numerals in FIG. 5B denote the same elements, and thus repeated descriptions thereof are omitted.

Referring to FIGS. 7 and 8, the display panel 10 may include the substrate 100, the organic insulating layer 119, the pixel electrode 211, the conductive layer CL, and the conductive patterns CP. The substrate 100 may include the display area DA, the peripheral area PA, and the middle area MA. The peripheral area PA may be arranged outside the display area DA. The middle area MA may be between the display area DA and the peripheral area PA. The organic insulating layer 119 may be arranged in the display area DA, the middle area MA, and the peripheral area PA. The organic insulating layer 119 may include an organic material.

The pixel electrode 211 may be disposed on the organic insulating layer 119. The pixel electrode 211 may overlap the display area DA. According to an embodiment, the pixel electrode 211 may include the first pixel electrode 211A, the second pixel electrode 211B, and the third pixel electrode 211C. The first pixel electrode 211A, the second pixel electrode 211B, and the third pixel electrode 211C may have different planar shapes.

The conductive layer CL may include the openings OP. The openings OP may be spaced apart from one another in the first direction (e.g., the x direction or the −x direction) or the second direction (e.g., the y direction or the −y direction).

The conductive patterns CP may be arranged on the organic insulating layer 119. The conductive patterns CP may overlap the middle area MA. Because the conductive patterns CP may be disposed in the middle area MA, a difference between the reflectivity of the display panel 10 in the middle area MA and the reflectivity of the display panel 10 in the peripheral area PA and the display area DA may be reduced.

The conductive patterns CP may be spaced apart from one another in the first direction (e.g., the x direction or the −x direction) or the second direction (e.g., the y direction or the −y direction). According to an embodiment, the conductive patterns CP may be dummy electrodes. The conductive patterns CP may be in a floating state. In other words, the conductive patterns CP may be electrically insulated from other electrodes or metals.

Referring to FIG. 7, the conductive patterns CP may include first conductive patterns CP1, second conductive patterns CP2, and third conductive patterns CP3 arranged side by side in a direction from the display area DA to the peripheral area PA. According to an embodiment, the first conductive patterns CP1, the second conductive patterns CP2, and the third conductive patterns CP3 may have the same planar shapes.

A first distance d1 between the first conductive pattern CP1 and the second conductive pattern CP2 may be greater than a second distance d2 between the second conductive pattern CP2 and the third conductive pattern CP3. In other words, an interval between adjacent conductive patterns CP may gradually increase in a direction from the peripheral area PA to the display area DA. Accordingly, an area through which the organic insulating layer 119 disposed in the display area DA may emit gas through the middle area MA adjacent to the display area DA may be increased, and thus, degradation of an emission layer may be prevented or reduced. Accordingly, the lifespan of the display panel 10 may be increased.

Referring to FIG. 8, the conductive patterns CP may include first conductive patterns CP1 and second conductive patterns CP2 arranged side by side in a direction from the display area DA to the peripheral area PA. According to an embodiment, the conductive patterns CP may include first conductive patterns CP1, second conductive patterns CP2, and third conductive patterns CP3 arranged side by side in a direction from the display area DA to the peripheral area PA.

A planar area of the first conductive pattern CP1 may be less than that of the second conductive pattern CP2. A planar area of the second conductive pattern CP2 may be less than that of the third conductive pattern CP3. A planar area of the conductive pattern CP may be an area occupied in an xy plan view of FIG. 8. In other words, a planar area of the conductive patterns CP may gradually decrease in a direction from the peripheral area PA to the display area DA. Accordingly, an area through which the organic insulating layer 119 disposed in the display area DA may emit gas through the middle area MA adjacent to the display area DA may be increased, and thus, degradation of an emission layer may be prevented or reduced. Accordingly, the lifespan of the display panel 10 may be increased.

Figure 9:
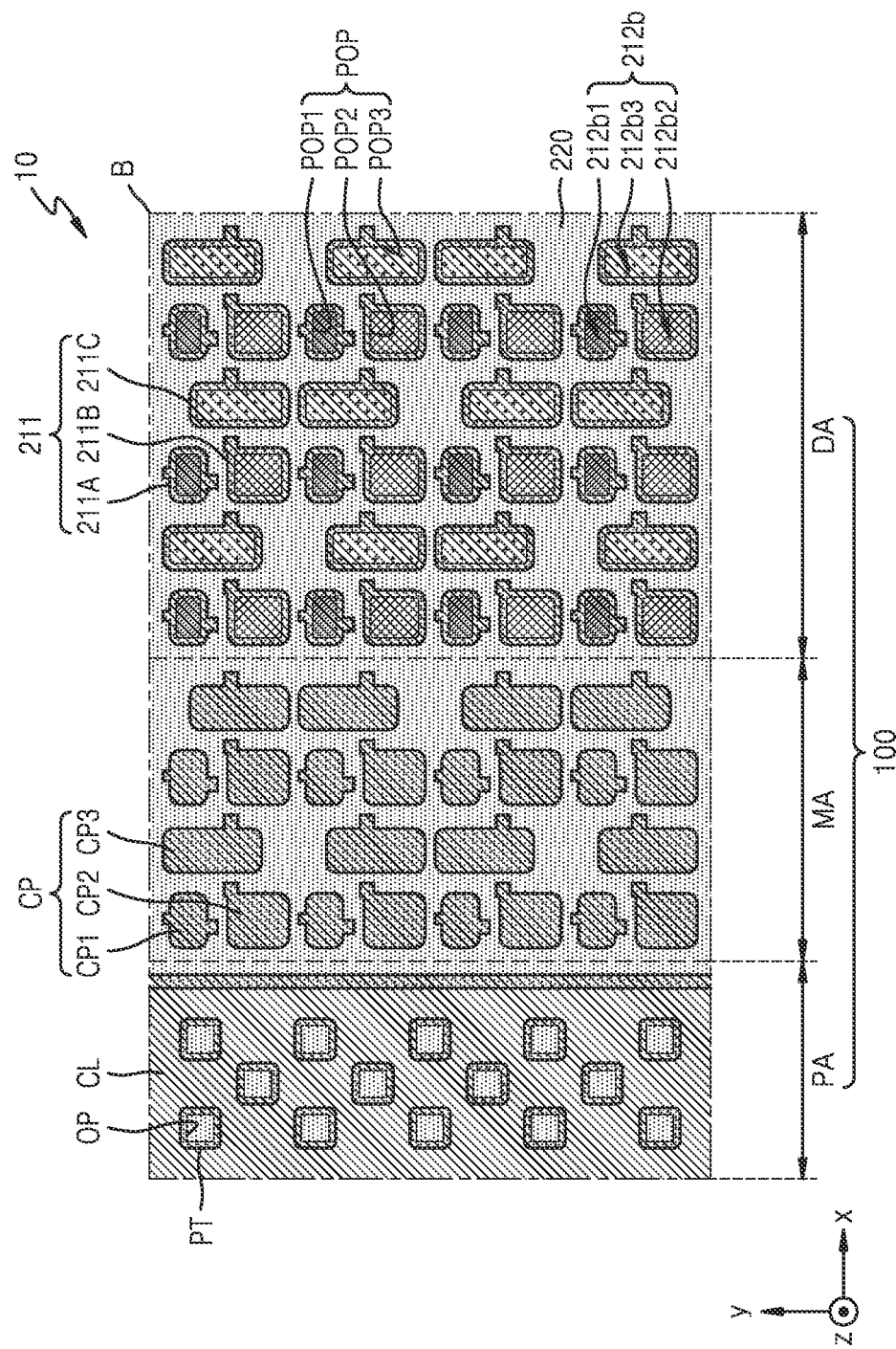
FIG. 9 is a schematic plan view of a magnified portion B of the display panel of FIG. 4, according to another embodiment.

FIG. 9 is a schematic plan view of a magnification of a portion B of the display panel 10 of FIG. 4, according to another embodiment. Reference numerals in FIG. 9 that are the same as the reference numerals in FIG. 5A denote the same elements, and thus repeated descriptions thereof are omitted.

Referring to FIG. 9, the display panel 10 may include the substrate 100, the organic insulating layer 119, the pixel electrode 211, the conductive layer CL, the conductive patterns CP, the pixel defining layer 220, the patterns PT, and the emission layer 212b. The substrate 100 may include the display area DA, the peripheral area PA, and the middle area MA. The peripheral area PA may be arranged outside the display area DA. The middle area MA may be between the display area DA and the peripheral area PA. The organic insulating layer may be arranged in the display area DA, the middle area MA, and the peripheral area PA. The organic insulating layer may include an organic material.

The pixel electrode 211 may be disposed on the organic insulating layer 119. The pixel electrode 211 may overlap the display area DA. According to an embodiment, the pixel electrode 211 may include the first pixel electrode 211A, the second pixel electrode 211B, and the third pixel electrode 211C. The first pixel electrode 211A, the second pixel electrode 211B, and the third pixel electrode 211C may have different planar shapes.

The conductive layer CL may include the openings OP. The openings OP may be spaced apart from one another in the first direction (e.g., the x direction or the −x direction) or the second direction (e.g., the y direction or the −y direction).

The conductive patterns CP may be arranged on the organic insulating layer 119. The conductive patterns CP may overlap the middle area MA. Because the conductive patterns CP may be disposed in the middle area MA, a difference between the reflectivity of the display panel 10 in the middle area MA and the reflectivity of the display panel 10 in the peripheral area PA and the display area DA may be reduced.

The conductive patterns CP may be spaced apart from one another in the first direction (e.g., the x direction or the −x direction) or the second direction (e.g., the y direction or the −y direction). According to an embodiment, the conductive patterns CP may be dummy electrodes. The conductive patterns CP may be in a floating state. In other words, the conductive patterns CP may be electrically insulated from other electrodes or metals.

The conductive patterns CP may have the same planar shapes as the pixel electrode 211. According to an embodiment, the planar shape of the pixel electrode 211 may be the same as that of one of the conductive patterns CP. The conductive patterns CP may include first conductive patterns CP1, second conductive patterns CP2, and third conductive patterns CP3. A planar shape of the first conductive pattern CP1 may be the same as that of the first pixel electrode 211A. A planar shape of the second conductive pattern CP2 may be the same as that of the second pixel electrode 211B. A planar shape of the third conductive pattern CP3 may be the same as that of the third pixel electrode 211C.

According to an embodiment, a layout of the first conductive pattern CP1, the second conductive pattern CP2, and the third conductive pattern CP3 may be substantially the same as that of the first pixel electrode 211A, the second pixel electrode 211B, and the third pixel electrode 211C. Thus, a difference between the reflectivity of the display panel 10 in the display area DA and the reflectivity of the display panel 10 in the middle area MA may be reduced.

The pixel defining layer 220 may include the pixel electrode opening POP overlapping the pixel electrode 211. The pixel electrode opening POP may expose the center portion of the pixel electrode 211. The patterns PT may overlap the peripheral area PA. The patterns PT may include the same material as that of the pixel defining layer 220. According to an embodiment, the patterns PT may be spaced apart from one another in the first direction (e.g., the x direction or the −x direction) and/or the second direction (e.g., the y direction or the −y direction).

The emission layer 212b may overlap the pixel electrode opening POP. The emission layer 212b may overlap the pixel electrode 211. According to an embodiment, the emission layer 212b may include a first emission layer 212b1, a second emission layer 212b2, and a third emission layer 212b3. The first emission layer 212b1 may overlap the first pixel electrode 211A and emit red light. The second emission layer 212b2 may overlap the second pixel electrode 211B and emit green light. The third emission layer 212b3 may overlap the third pixel electrode 211C and emit blue light.

The emission layer 212b may not overlap the conductive patterns CP. The first emission layer 212b1 may not overlap the first conductive pattern CP1. The second emission layer 212b2 may not overlap the second conductive pattern CP2. The third emission layer 212b3 may not overlap the third conductive pattern CP3.

Figure 10A:
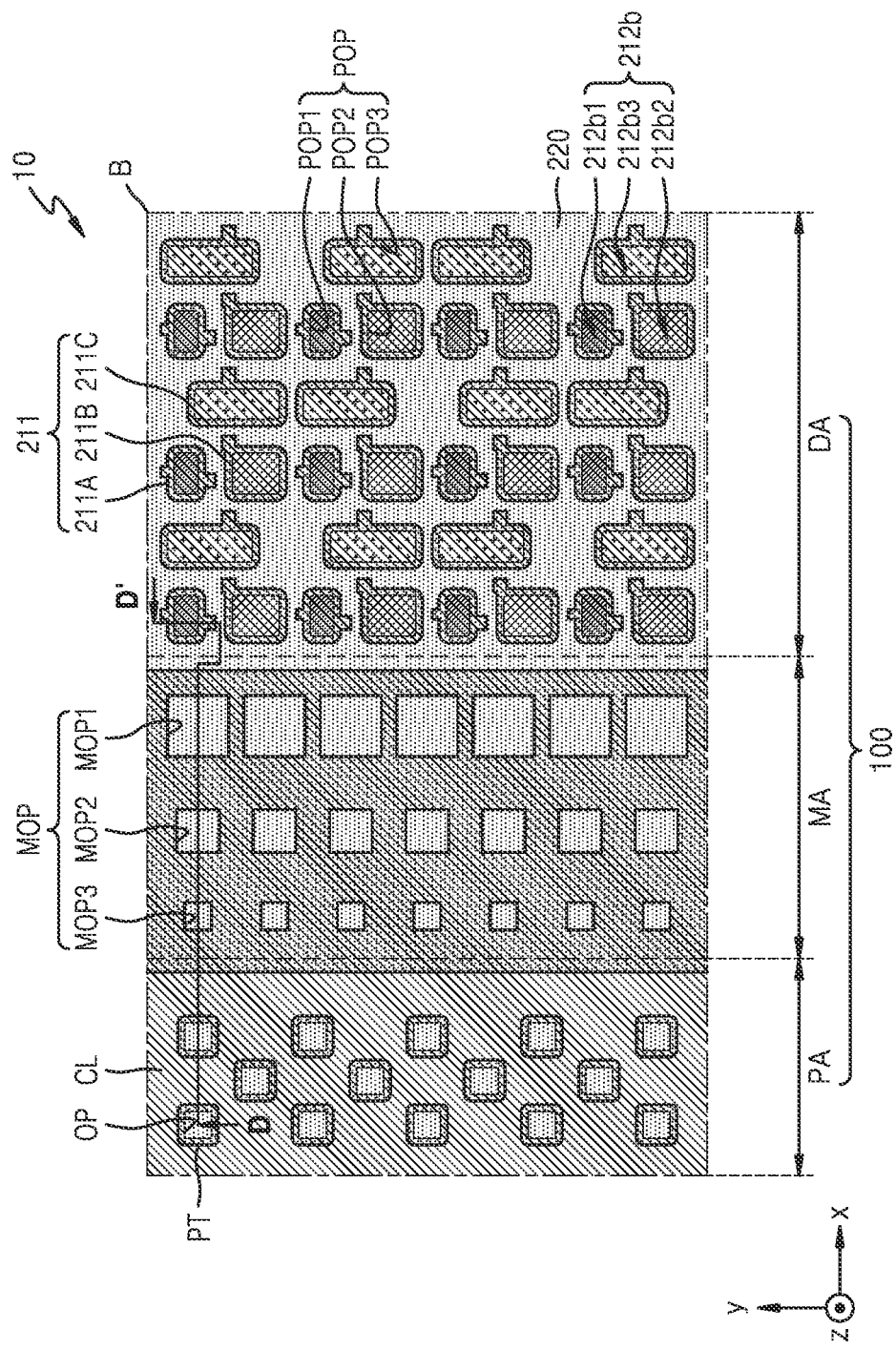
FIGS. 10A and 10B are schematic plan views of a magnified portion B of the display panel of FIG. 4, according to another embodiment.
Figure 10B:
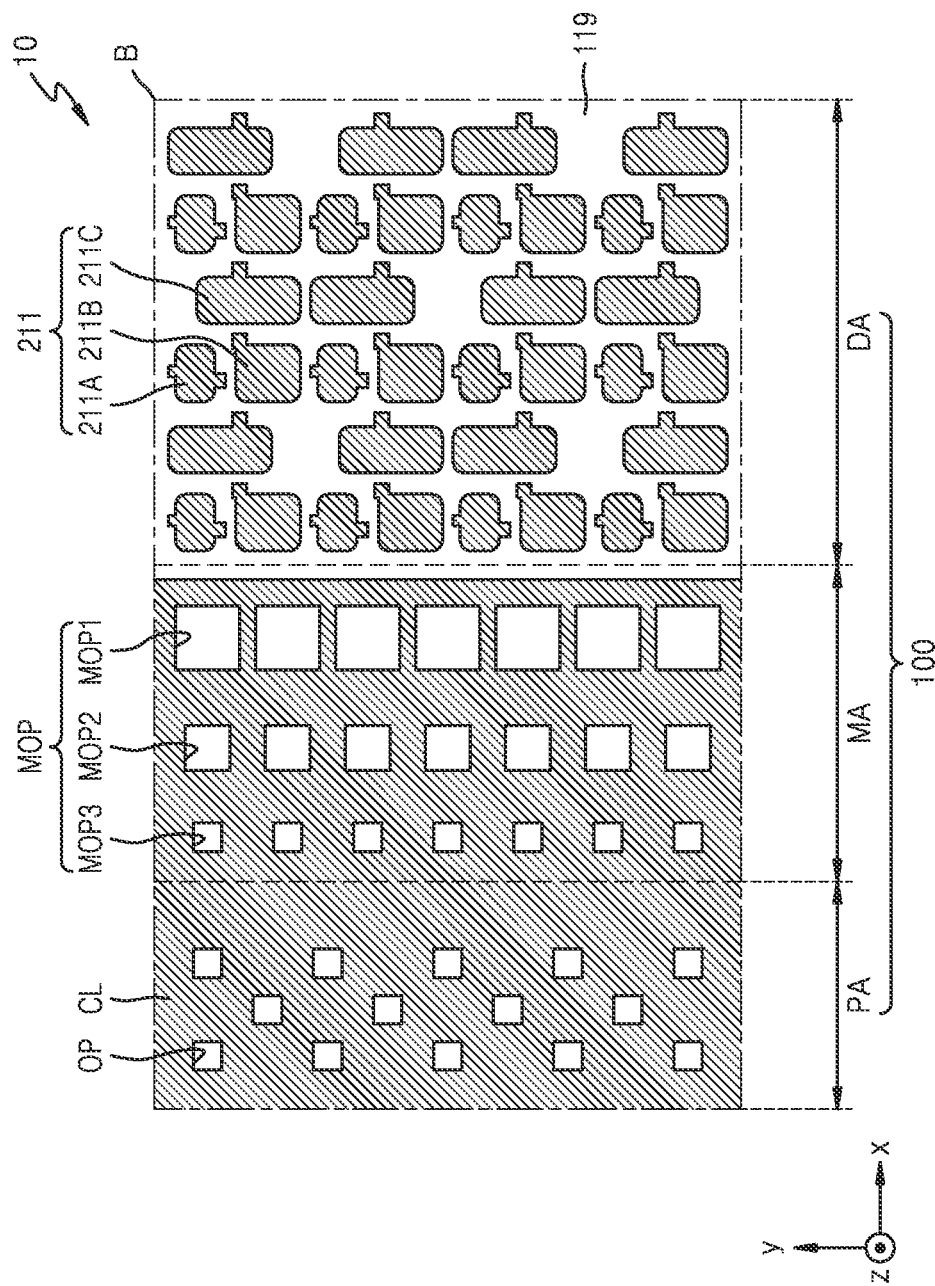

FIGS. 10A and 10B are schematic plan views of a magnified portion B of the display panel 10 of FIG. 4, according to another embodiment. FIG. 10B is a plan view illustrating some of the components illustrated in FIG. 10A. Reference numerals in FIGS. 10A and 10B that are the same as the reference numerals in FIGS. 5A and 5B denote the same elements, and thus repeated descriptions thereof are omitted.

Referring to FIGS. 10A and 10B, the display panel 10 may include the substrate 100, the organic insulating layer 119, the pixel electrode 211, the conductive layer CL, the pixel defining layer 220, the patterns PT, and the emission layer 212b. The substrate 100 may include the display area DA, the peripheral area PA, and the middle area MA. The peripheral area PA may be arranged outside the display area DA. The middle area MA may be between the display area DA and the peripheral area PA. A pixel circuit may be arranged in the display area DA. According to an embodiment, the pixel circuit may include a first transistor and a first storage capacitor. A driving circuit may be arranged in the peripheral area PA. According to an embodiment, the driving circuit may include a second transistor and a second storage capacitor. According to an embodiment, the pixel circuit and the driving circuit may not be arranged in the middle area MA. The organic insulating layer 119 may be arranged in the display area DA, the middle area MA, and the peripheral area PA. The organic insulating layer 119 may include an organic material.

The pixel electrode 211 may be disposed on the organic insulating layer 119. The pixel electrode 211 may overlap the display area DA. According to an embodiment, the pixel electrode 211 may include the first pixel electrode 211A, the second pixel electrode 211B, and the third pixel electrode 211C. The first pixel electrode 211A, the second pixel electrode 211B, and the third pixel electrode 211C may have different planar shapes.

The conductive layer CL may be disposed on the organic insulating layer 119. The conductive layer CL may overlap the peripheral area PA and the middle area MA. The conductive layer CL may include the same material as that of the pixel electrode 211.

The conductive layer CL may include the openings OP and middle openings MOP. The openings OP may overlap the peripheral area PA. The openings OP may be spaced apart from one another in the first direction (e.g., the x direction or the −x direction) or the second direction (e.g., the y direction or the −y direction). Gas emitted from the organic insulating layer 119 may escape through the openings OP.

The middle openings MOP may overlap the middle area MA. The middle openings MOP may be spaced apart from one another in the first direction (e.g., the x direction or the −x direction) or the second direction (e.g., the y direction or the −y direction). Gas emitted from the organic insulating layer 119 may escape through the middle openings MOP. According to an embodiment, because the conductive layer CL including the middle openings MOP may be disposed in the middle area MA, a difference between the reflectivity of the display panel 10 in the middle area MA and the reflectivity of the display panel 10 in the peripheral area PA and the display area DA may be reduced. Accordingly, a band shape may not be visually recognized on the display panel 10.

The middle openings MOP may include first middle openings MOP1 and second middle openings MOP2 arranged side by side in a direction from the display area DA to the peripheral area PA. According to an embodiment, the middle openings MOP may include first middle openings MOP1, second middle openings MOP2, and third middle openings MOP arranged side by side in a direction from the display area DA to the peripheral area PA. According to an embodiment, a planar area of the first middle openings MOP1 may be greater than that of the second middle openings MOP2. A planar area of the second middle opening MOP2 may be greater than that of the third middle opening MOP3. A planar area of the middle opening MOP may be an area by which the middle opening MOP exposes the organic insulating layer 119 in an xy plan view of FIG. 10B. In other words, an area of the middle openings MOP may gradually increase in a direction from the peripheral area PA to the display area DA. Accordingly, an area through which the organic insulating layer 119 disposed in the display area DA may emit gas through the middle area MA adjacent to the display area DA may be increased, and thus, degradation of an emission layer 212b may be prevented or reduced. Accordingly, the lifespan of the display panel 10 may be increased.

The pixel defining layer 220 may extend from the display area DA to the middle area MA and may cover an edge of the conductive layer CL. Accordingly, the pixel defining layer 220 may prevent or reduce damage to the edge of the conductive layer CL. The pixel defining layer 220 may continuously extend in the middle area MA. The pixel defining layer 220 may cover the middle openings MOP. The pixel defining layer 220 may cover a second inner edge of the conductive layer CL that defines the middle openings MOP. Accordingly, the pixel defining layer 220 may prevent or reduce damage to the second inner edge of the conductive layer CL that defines the middle openings MOP, during the manufacture of the display panel 10. According to an embodiment, the pixel defining layer 220 may extend from the middle area MA to the peripheral area PA.

The patterns PT may overlap the peripheral area PA. The patterns PT may include the same material as that of the pixel defining layer 220. According to an embodiment, the patterns PT may be spaced apart from one another in the first direction (e.g., the x direction or the −x direction) and/or the second direction (e.g., the y direction or the −y direction). According to an embodiment, the patterns PT may overlap the openings OP, respectively. The patterns PT may cover a first inner edge of the conductive layer CL that defines the openings OP. Accordingly, the patterns PT may prevent or reduce damage to the first inner edge of the conductive layer CL during the manufacture of the display panel 10.

Figure 11:
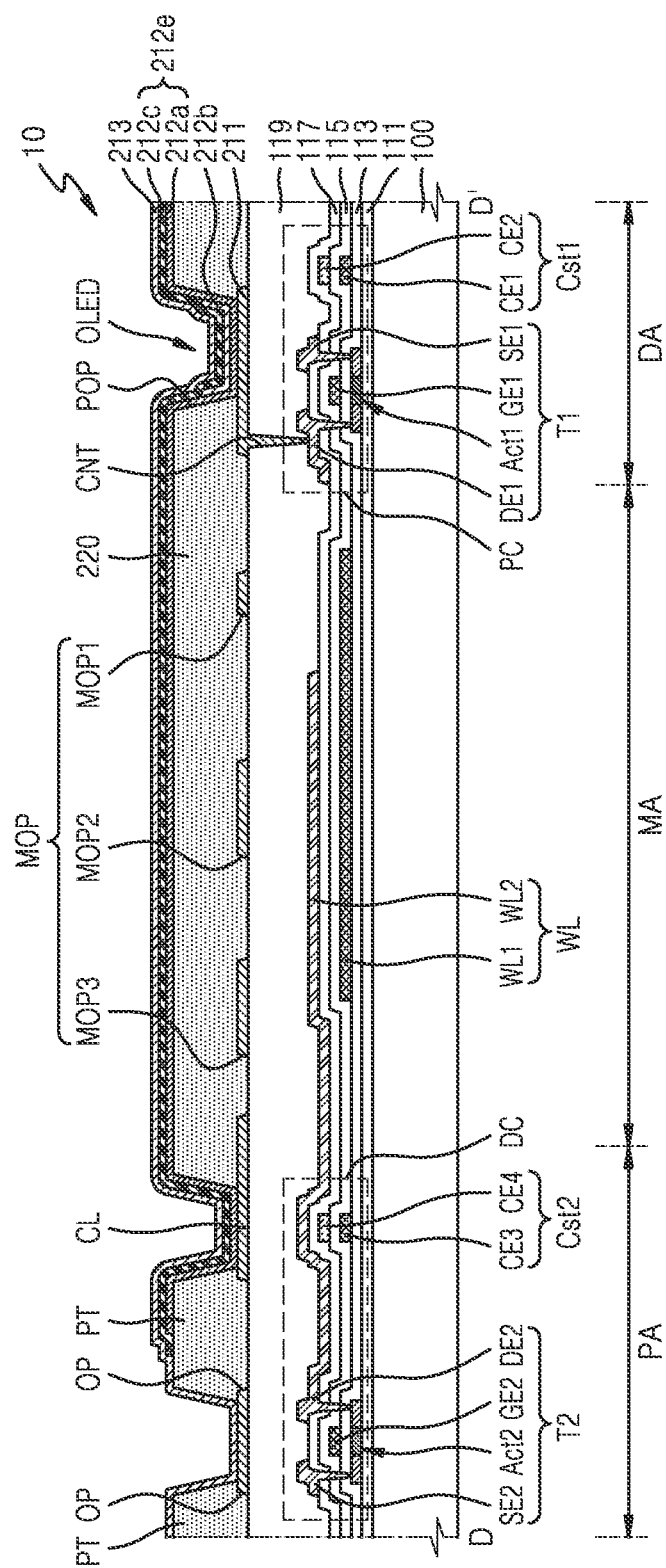
FIG. 11 is a schematic cross-sectional view of the display panel of FIG. 10A taken along line D-D' of FIG. 10A.

FIG. 11 is a schematic cross-sectional view of the display panel 10 of FIG. 10A taken along line D-D' of FIG. 10A. Reference numerals in FIG. 11 that are the same as the reference numerals in FIG. 6 denote the same elements, and thus repeated descriptions thereof are omitted.

Referring to FIG. 11, the display panel 10 may include the substrate 100 and a display layer. The substrate 100 may include the display area DA, the peripheral area PA, and the middle area MA. The peripheral area PA may be arranged outside the display area DA. The middle area MA may be between the display area DA and the peripheral area PA.

The display layer may be disposed on the substrate 100. The display layer may include a pixel circuit layer and a display element layer. The pixel circuit layer may include the buffer layer 111, the first gate insulating layer 113, the second gate insulating layer 115, the interlayer insulating layer 117, the pixel circuit PC, the wire WL, the driving circuit DC, and the organic insulating layer 119.

According to an embodiment, the pixel circuit PC and the driving circuit DC may be between the substrate 100 and the organic insulating layer 119. The pixel circuit PC may overlap the display area DA. The driving circuit DC may overlap the peripheral area PA. The pixel circuit PC and the driving circuit DC may not overlap the middle area MA. According to an embodiment, the pixel circuit PC may include at least one first transistor T1 and at least one first storage capacitor Cst1. According to an embodiment, the at least one first transistor T1 may include the first semiconductor layer Act1, the first gate electrode GE1, the first source electrode SE1, and the first drain electrode DE1. The at least one first storage capacitor Cst1 may include the first electrode CE1 and the second electrode CE2. According to an embodiment, the driving circuit DC may include at least one second transistor T2 and at least one second storage capacitor Cst2. According to an embodiment, the at least one second transistor T2 may include the second semiconductor layer Act2, the second gate electrode GE2, the second source electrode SE2, and the second drain electrode DE2. The at least one second storage capacitor Cst2 may include the third electrode CE3 and the fourth electrode CE4.

The organic insulating layer 119 may be disposed on the first source electrode SE1, the first drain electrode DE1, the second source electrode SE2, the second drain electrode DE2, the second wire WL2, and the interlayer insulating layer 117. The organic insulating layer 119 may be arranged in the display area DA, the middle area MA, and the peripheral area PA. The organic insulating layer 119 may include an organic material.

The display element layer may be disposed on the pixel circuit layer. The display element layer may include the organic light-emitting diode OLED, the conductive layer CL, the pixel defining layer 220, and the patterns PT.

The organic light-emitting diode OLED, which may be a display element, may include the pixel electrode 211, the emission layer 212b, and the opposite electrode 213. The pixel electrode 211 may be connected to the pixel circuit PC through the contact hole CNT included in the organic insulating layer 119. Accordingly, the organic light-emitting diode OLED may be controlled by the pixel circuit PC.

The conductive layer CL may be disposed on the organic insulating layer 119. The conductive layer CL may overlap the peripheral area PA and the middle area MA. The conductive layer CL may include the same material as that of the pixel electrode 211. According to an embodiment, the conductive layer CL may be a power wire. The conductive layer CL may transmit a second power supply voltage to the opposite electrode 213. The conductive layer CL, which may be a layer for reducing static electricity, may protect the driving circuit DC.

The conductive layer CL may include the openings OP and the middle openings MOP. The openings OP may overlap the peripheral area PA. The middle openings MOP may overlap the middle area MA.

According to an embodiment, the middle openings MOP may include the first middle openings MOP1, the second middle openings MOP2, and the third middle openings MOP arranged side by side in a direction from the display area DA to the peripheral area PA. According to an embodiment, a planar area of the first middle opening MOP1 may be greater than that of the second middle opening MOP2. A planar area of the second middle opening MOP2 may be greater than that of the third middle opening MOP3.

The openings OP may at least partially expose a portion of the organic insulating layer 119 arranged in the peripheral area PA. The middle openings MOP may at least partially expose a portion of the organic insulating layer 119 arranged in the middle area MA. Thus, gas may be emitted from the organic insulating layer 119 disposed in the peripheral area PA and the middle area MA, and degradation of the emission layer 212b may be prevented or reduced. Accordingly, the lifespan of the display panel 10 may be increased. A difference between the reflectivity of the display panel 10 in the middle area MA and the reflectivity of the display panel 10 in the peripheral area PA and the display area DA may be reduced. Accordingly, a band shape may not be visually recognized on the display panel 10.

The pixel defining layer 220 may be disposed on the pixel electrode 211 and the conductive layer CL. The pixel defining layer 220 may include an organic insulating material and/or an inorganic insulating material. According to some embodiments, the pixel defining layer 220 may include a light blocking material.

The pixel defining layer 220 may include the pixel electrode opening POP overlapping the pixel electrode 211. The pixel electrode opening POP may expose the center portion of the pixel electrode 211. The pixel electrode opening POP may define a light-emission area of light emitted by an organic light-emitting diode.

The pixel defining layer 220 may extend from the display area DA to the middle area MA and may cover an edge of the conductive layer CL. Accordingly, the pixel defining layer 220 may prevent or reduce damage to the edge of the conductive layer CL during the manufacture of the display panel 10. The pixel defining layer 220 may continuously extend in the middle area MA. The pixel defining layer 220 may cover the middle openings MOP. According to an embodiment, the pixel defining layer 220 may cover a second inner edge of the conductive layer CL that defines the middle openings MOP. Accordingly, the pixel defining layer 220 may prevent or reduce damage to the second inner edge of the conductive layer CL during the manufacture of the display panel 10. According to an embodiment, the pixel defining layer 220 may extend from the middle area MA to the peripheral area PA.

The patterns PT may overlap the peripheral area PA. The patterns PT may include the same material as that of the pixel defining layer 220. According to an embodiment, the patterns PT may overlap the openings OP, respectively. According to an embodiment, the patterns PT may be spaced apart from one another in the first direction (e.g., the x direction or the −x direction) and/or the second direction (e.g., the y direction or the −y direction). The patterns PT may cover a first inner edge of the conductive layer CL that defines the openings OP. Accordingly, the patterns PT may prevent or reduce damage to the first inner edge of the conductive layer CL during the manufacture of the display panel 10.

The emission layer 212*b* may overlap the pixel electrode opening POP. The emission layer 212*b* may overlap the pixel electrode 211. The emission layer 212*b* may include a low molecular weight or high molecular weight organic material that emits light of a certain color.

The organic light-emitting diode OLED may further include the functional layer 212*e*. The functional layer 212*e* may include at least one of the first functional layer 212*a* and the second functional layer 212*c*. The functional layer 212*e* may extend from the pixel electrode opening POP to the middle area MA. The functional layer 212*e* may extend from the middle area MA to the peripheral area PA. The functional layer 212*e* may have an edge arranged in the peripheral area PA. According to an embodiment, the functional layer 212*e* may directly contact a portion of the conductive layer CL, and may not contact another portion of the conductive layer CL.

The opposite electrode 213 may be disposed on the pixel electrode 211, the emission layer 212*b*, the functional layer 212*e*, and the pixel defining layer 220. The opposite electrode 213 may extend from the display area DA to the middle area MA. The opposite electrode 213 may extend from the middle area MA to the peripheral area PA. The opposite electrode 213 may directly contact the conductive layer CL. Thus, the conductive layer CL may supply a second power supply voltage to the opposite electrode 213 while maintaining a low resistance.

As described above, a display apparatus according to an embodiment may include conductive patterns that may be disposed on an organic insulating layer, overlap a middle area, and may be spaced apart from one another. The conductive patterns may include the same material as that included in a conductive layer overlapping a peripheral area and including openings and a pixel electrode overlapping a display area. Thus, the organic insulating layer may be exposed in the middle area in order to achieve outgassing, and a reflectivity difference may be reduced.

The display apparatus according to an embodiment may also include a conductive layer including openings overlapping the peripheral area and middle openings overlapping the middle area. The middle openings may include first middle openings and second middle openings overlapping the middle area and arranged side by side in a direction from the display area to the peripheral area, and a planar area of the first middle opening may be greater than that of the second middle opening. Thus, the organic insulating layer may be exposed in the middle area in order to achieve outgassing, and a reflectivity difference may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of this disclosure.

What is claimed is:

1. A display apparatus comprising:
   a display area;
   a peripheral area outside the display area;
   a middle area between the display area and the peripheral area;
   an organic insulating layer disposed in the display area, the middle area, and the peripheral area;
   a pixel electrode disposed on the organic insulating layer and in the display area;
   a conductive layer disposed on the organic insulating layer, disposed in the peripheral area, and including openings; and
   conductive patterns disposed on the organic insulating layer, disposed in the middle area, and spaced apart from one another; and
   a driving circuit in the peripheral area, wherein
   the pixel electrode, the conductive layer, and the conductive patterns include a same material,
   the conductive patterns include a first conductive pattern, a second conductive pattern, and a third conductive pattern disposed side by side in a direction from the display area to the peripheral area.

2. The display apparatus of claim 1, further comprising:
   a pixel circuit between a substrate and the organic insulating layer, disposed in the display area, and including at least one first transistor and at least one first storage capacitor, wherein;
   the driving circuit is between the substrate and the organic insulating layer and the driving circuit includes at least one second transistor and at least one second storage capacitor, and wherein the pixel circuit is electrically connected to the pixel electrode through a contact hole in the organic insulating layer.

3. The display apparatus of claim 2, wherein no transistors and no storage capacitors are disposed in the middle area.

4. The display apparatus of claim 1, further comprising:
a pixel defining layer disposed on the pixel electrode and the conductive patterns and including a pixel electrode opening overlapping the pixel electrode in a plan view,
wherein the pixel defining layer extends in the middle area.

5. The display apparatus of claim 4, further comprising:
patterns disposed on the conductive layer and overlapping the openings in a plan view,
wherein the patterns and the pixel defining layer include a same material.

6. The display apparatus of claim 4, further comprising:
an emission layer disposed on the pixel electrode opening; and
a functional layer including at least one of a first functional layer between the pixel electrode and the emission layer and a second functional layer disposed on the emission layer,
wherein the functional layer extends from the pixel electrode opening to the middle area.

7. The display apparatus of claim 6, wherein the functional layer extends from the middle area to the peripheral area.

8. The display apparatus of claim 6, further comprising:
an opposite electrode between the emission layer and the functional layer,
wherein the opposite electrode extends from the display area to the peripheral area and directly contacts the conductive layer.

9. The display apparatus of claim 1, further comprising:
a substrate; and
a wire, wherein
the organic insulating layer is on the substrate,
the wire is between the substrate and the organic insulating layer and the wire is disposed in the middle area.

10. The display apparatus of claim 1, wherein
a first distance between the first conductive pattern and the second conductive pattern is equal to a second distance between the second conductive pattern and the third conductive pattern.

11. A display apparatus comprising:
a display area;
a peripheral area outside the display area;
a middle area between the display area and the peripheral area;
an organic insulating layer disposed in the display area, the middle area, and the peripheral area;
a pixel electrode disposed on the organic insulating layer and in the display area;
a conductive layer disposed on the organic insulating layer, disposed in the peripheral area, and including openings; and
conductive patterns disposed on the organic insulating layer, disposed in the middle area, and spaced apart from one another,
wherein the pixel electrode, the conductive layer, and the conductive patterns include a same material,
the conductive patterns include a first conductive pattern, a second conductive pattern, and a third conductive pattern disposed side by side in a direction from the display area to the peripheral area, and a first distance between the first conductive pattern and the second conductive pattern is greater than a second distance between the second conductive pattern and the third conductive pattern.

12. The display apparatus of claim 1, wherein
the conductive patterns include a first conductive pattern and a second conductive pattern disposed side by side in a direction from the display area to the peripheral area, and
a planar area of the first conductive pattern is less than a planar area of the second conductive pattern.

13. The display apparatus of claim 1, wherein a planar area of the pixel electrode is substantially equal to a planar area of one of the conductive patterns.

14. The display apparatus of claim 13, wherein
the pixel electrode includes a first pixel electrode, a second pixel electrode, and a third pixel electrode having different planar shapes,
the conductive patterns includes a first conductive pattern, a second conductive pattern, and a third conductive pattern,
a planar shape of the first conductive pattern is substantially equal to a planar shape of the first pixel electrode,
a planar shape of the second conductive pattern is substantially equal to a planar shape of the second pixel electrode, and
a planar shape of the third conductive pattern is substantially equal to a planar shape of the third pixel electrode.

15. The display apparatus of claim 14, further comprising:
a first emission layer overlapping the first pixel electrode in a plan view and emitting red light;
a second emission layer overlapping the second pixel electrode in a plan view and emitting green light; and
a third emission layer overlapping the third pixel electrode in a plan view and emitting blue light.

16. A display apparatus comprising:
a display area;
a peripheral area outside the display area;
a middle area between the display area and the peripheral area;
an organic insulating layer disposed in the display area, the middle area, and the peripheral area;
a pixel electrode disposed on the organic insulating layer and in the display area; and
a conductive layer disposed on the organic insulating layer and including openings disposed in the peripheral area and middle openings disposed in the middle area, wherein
the pixel electrode and the conductive layer include a same material,
the middle openings include a first middle opening and a second middle opening disposed in the middle area and disposed side by side in a direction from the display area to the peripheral area, and
a planar area of the first middle opening is greater than a planar area of the second middle opening.

17. The display apparatus of claim 16, further comprising:
a pixel circuit between a substrate and the organic insulating layer, disposed in the display area, and including at least one first transistor and at least one first storage capacitor; and
a driving circuit between the substrate and the organic insulating layer, disposed in the peripheral area, and including at least one second transistor and at least one second storage capacitor, wherein the pixel circuit is electrically connected to the pixel electrode through a contact hole in the organic insulating layer.

18. The display apparatus of claim 17, wherein no transistors and no storage capacitors are disposed in the middle area.

19. The display apparatus of claim 16, further comprising:
a pixel defining layer disposed on the pixel electrode and the conductive layer and including a pixel electrode opening overlapping the pixel electrode in a plan view; and
patterns disposed on the conductive layer and overlapping the openings in a plan view, wherein
the pixel defining layer extends in the middle area, and
the patterns and the pixel defining layer include a same material.

20. The display apparatus of claim 19, further comprising:
an emission layer disposed on the pixel electrode opening;
a functional layer including at least one of a first functional layer between the pixel electrode and the emission layer and a second functional layer disposed on the emission layer; and
an opposite electrode between the emission layer and the functional layer,
wherein the opposite electrode extends from the display area to the peripheral area and directly contacts the conductive layer in the peripheral area.

\* \* \* \* \*